United States Patent
Kim et al.

(10) Patent No.: US 12,113,108 B2
(45) Date of Patent: Oct. 8, 2024

(54) INTEGRATED CIRCUIT DEVICE

(71) Applicant: Samsung Electronics Co., Ltd., Suwon-si (KR)

(72) Inventors: Dohee Kim, Seoul (KR); Gyeom Kim, Hwaseong-si (KR); Jinbum Kim, Seoul (KR); Haejun Yu, Osan-si (KR); Kyungin Choi, Seoul (KR); Kihyun Hwang, Seongnam-si (KR); Seunghun Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 293 days.

(21) Appl. No.: 17/472,926

(22) Filed: Sep. 13, 2021

(65) Prior Publication Data

US 2022/0246738 A1  Aug. 4, 2022

(30) Foreign Application Priority Data

Feb. 4, 2021  (KR) .................. 10-2021-0016282

(51) Int. Cl.
  *H01L 29/41* (2006.01)
  *H01L 27/088* (2006.01)
  *H01L 29/417* (2006.01)

(52) U.S. Cl.
  CPC .... *H01L 29/41775* (2013.01); *H01L 27/0886* (2013.01)

(58) Field of Classification Search
  CPC ......... H01L 29/66545; H01L 21/76846; H01L 21/76849; H01L 29/7845; H01L 21/76834; H01L 29/41791; H01L 21/76801; H01L 21/0337; H01L 21/28247; H01L 21/28568; H01L 21/3086; H01L 21/31105; H01L 21/31144; H01L 21/76224; H01L 21/823481; H01L 21/823807; H01L 21/823814; H01L 21/823821; H01L 21/823842; H01L 21/823857; H01L 21/823871; H01L 21/823878; H01L 23/5283; H01L 23/53266; H01L 27/0924;
  (Continued)

(56) References Cited

U.S. PATENT DOCUMENTS 5,955,786 A   9/1999   Avanzino et al.
6,372,569 B1  4/2002   Lee et al.
(Continued)

FOREIGN PATENT DOCUMENTS

KR   20010008839 A   2/2001

*Primary Examiner* — Moin M Rahman
(74) *Attorney, Agent, or Firm* — Myers Bigel, P.A.

(57) ABSTRACT

An integrated circuit device includes a plurality of gate structures each including a gate line extending on a fin-type active region and insulation spacers on sidewalls of the gate line; a source/drain contact between first and second gate structures, and having opposing sides that are asymmetric in the first horizontal direction; and an insulation liner on sidewalls of the source/drain contact. The source/drain contact includes a lower contact portion and an upper contact portion having a horizontal extension that extends on an upper corner of the first gate structure, the insulation liner includes a first local region between the upper corner and the horizontal extension and a second local region that is farther from the substrate than the first local region, and a thickness of the first local region is greater than that of the second local region.

20 Claims, 25 Drawing Sheets

(58) Field of Classification Search
CPC . H01L 27/1104; H01L 28/24; H01L 29/0847; H01L 29/516; H01L 29/6653; H01L 29/7854; H01L 21/28518; H01L 23/5329; H01L 27/0207; H01L 28/20; H01L 29/41783; H01L 21/02532; H01L 21/02636; H01L 21/76802; H01L 21/76877; H01L 21/823828; H01L 23/528; H01L 27/0922; H01L 29/167; H01L 29/66636; H01L 29/7851; H01L 29/66795; H01L 29/7846; H01L 29/785; H01L 29/165; H01L 21/76897; H01L 23/5226; H01L 23/53209; H01L 23/53238; H01L 21/76816; H01L 29/0649; H01L 29/66818; H01L 29/7848; H01L 29/7843; H01L 27/0886; H01L 21/76232; H01L 29/6656; H01L 29/0653; H01L 21/823431; H01L 21/76883; H01L 21/76885; H01L 29/665; H01L 21/02164; H01L 21/0217; H01L 21/0332; H01L 21/823437; H01L 21/823475; H01L 24/16; H01L 29/7842; H01L 29/7853; H01L 2224/16227; H01L 24/32; H01L 24/73; H01L 2224/32225; H01L 2224/73204; H01L 23/485; H01L 29/41775; H01L 29/42324; H01L 29/4234; H01L 21/31111; H01L 21/31155; H01L 29/40114; H01L 29/40117; H01L 29/7883; H01L 21/76831; H01L 21/76805; H01L 29/78; H01L 21/8238–823892; H01L 27/092–0928; H01L 29/04–045; H01L 29/16–1608; H01L 29/18–185; H01L 29/22–2206; H01L 29/36–365; H01L 21/823493; H01L 21/823885; H01L 21/823412; H01L 29/66522; H01L 29/20–2006; H10B 43/27; H10B 41/27; H10B 41/30; H10B 43/30; H10B 43/40; H10B 43/10; H10B 43/50; H10B 41/35; H10B 41/50; H10B 43/35; H10B 41/41; H10B 41/10; H10B 41/20; H10B 41/40; H10B 41/44; H10B 41/43; H10B 41/42; H10B 43/00; H10B 43/20; H10B 43/23; H10B 51/00; H10B 51/10; H10B 51/20; H10B 51/30; H10B 51/40; H10B 51/50; H10B 53/10; H10B 53/20; H10B 53/22; H10B 63/30; H10B 63/32; H10B 63/34; H10B 63/80; H10B 63/84; H10B 99/00; H10B 99/10; H10B 99/02

See application file for complete search history.

(56) References Cited

U.S. PATENT DOCUMENTS

| | | | |
|---|---|---|---|
| 6,960,523 | B2 | 11/2005 | Maldei et al. |
| 7,397,131 | B2 | 7/2008 | Kim et al. |
| 7,867,835 | B2 | 1/2011 | Lee et al. |
| 7,968,949 | B2 | 6/2011 | Edelstein et al. |
| 10,395,995 | B2 | 8/2019 | Pranatharthiharan et al. |
| 10,475,699 | B2 | 11/2019 | Hsieh et al. |
| 2017/0309625 | A1* | 10/2017 | Kim ................ H01L 21/823456 |
| 2020/0105867 | A1 | 4/2020 | Lee et al. |
| 2021/0098468 | A1* | 4/2021 | Chen ................ H01L 21/76897 |

\* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2021-0016282, filed on Feb. 4, 2021, in the Korean Intellectual Property Office, the disclosure of which is incorporated by reference herein in its entirety.

FIELD

The inventive concept relates to an integrated circuit device, and more particularly, to an integrated circuit device including a field effect transistor.

BACKGROUND

With the rapid down-scaling of integrated circuit devices, it may be necessary to secure not only a fast operating speeds, but also operating accuracy in an integrated circuit device. Therefore, it may be desirable to develop integrated circuit devices having a structure capable of improving reliability by improving electrical characteristics in a reduced device area.

SUMMARY

The inventive concept provides an integrated circuit device having a structure capable of improving electrical characteristics and reliability within a reduced device area due to down-scaling.

According to an aspect of the inventive concept, there is provided an integrated circuit device including a fin-type active region extending along a first horizontal direction on a substrate; a plurality of gate structures each including a gate line extending along a second horizontal direction crossing the first horizontal direction on the fin-type active region and insulation spacers on sidewalls of the gate line; a source/drain contact between a first gate structure and a second gate structure, which are among the gate structures and are adjacent to each other, and having opposing sides that are asymmetric in the first horizontal direction; and an insulation liner on sidewalls of the source/drain contact, wherein the source/drain contact includes a lower contact portion facing the first gate structure and the second gate structure in the first horizontal direction and an upper contact portion that is integral to the lower contact portion, the upper contact portion includes a horizontal extension, which extends on an upper corner of the first gate structure adjacent to the source/drain contact and overlaps at least a portion of the first gate structure in a vertical direction, the insulation liner includes a first local region between the upper corner of the first gate structure and the horizontal extension of the source/drain contact and a second local region that is farther from the substrate than the first local region, and a thickness of the first local region is greater than that of the second local region.

According to another aspect of the inventive concept, there is provided an integrated circuit device including a fin-type active region extending along a first horizontal direction on a substrate; a plurality of gate structures extending along a second horizontal direction crossing the first horizontal direction on the fin-type active regions; a source/drain region on the fin-type active region between a pair of gate structures among the gate structures, wherein the pair of gate structures are adjacent to each other; a source/drain contact that extends along a vertical direction on the source/drain region and has opposing sides in the first horizontal direction that are asymmetric; and an insulation liner on sidewalls of the source/drain contact, wherein the source/drain contact includes a lower contact portion facing the pair of gate structures in the first horizontal direction and an upper contact portion that is integral to the lower contact portion, the upper contact portion includes a horizontal extension, which extends on an upper corner of a first gate structure of the pair of gate structures and overlaps at least a portion of the first gate structure in the vertical direction, the insulation liner includes a first local region between the upper corner of the first gate structure and the horizontal extension of the source/drain contact and a second local region that is farther from the substrate than the first local region, and a thickness of the first local region is greater than that of the second local region.

According to another aspect of the inventive concept, there is provided an integrated circuit device including a fin-type active region extending along a first horizontal direction on a substrate; a source/drain region on the fin-type active region, a pair of nanosheet stacks on a fin top surface of the fin-type active region and spaced apart from each other in the first horizontal direction with the source/drain region therebetween, a pair of gate structures including a pair of gate lines that surround the pair of nanosheet stacks on the fin-type active region and extend along a second horizontal direction crossing the first horizontal direction and a pair of outer insulation spacers on sidewalls of the pair of gate lines; a source/drain contact that extends along a vertical direction on the source/drain region and has opposing sides in the first horizontal direction that are asymmetric; and an insulation liner on sidewalls of the source/drain contact, wherein the source/drain contact includes a lower contact portion between the pair of gate structures in the first horizontal direction and an upper contact portion extending from the lower contact portion, the upper contact portion includes a horizontal extension, which extends on an upper corner of a first gate structure of the pair of gate structures and overlaps at least a portion of the first gate structure in the vertical direction, the insulation liner includes a first local region between the upper corner of the first gate structure and the horizontal extension of the source/drain contact and a second local region that is farther from the substrate than the first local region, and a thickness of the first local region is greater than that of the second local region.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
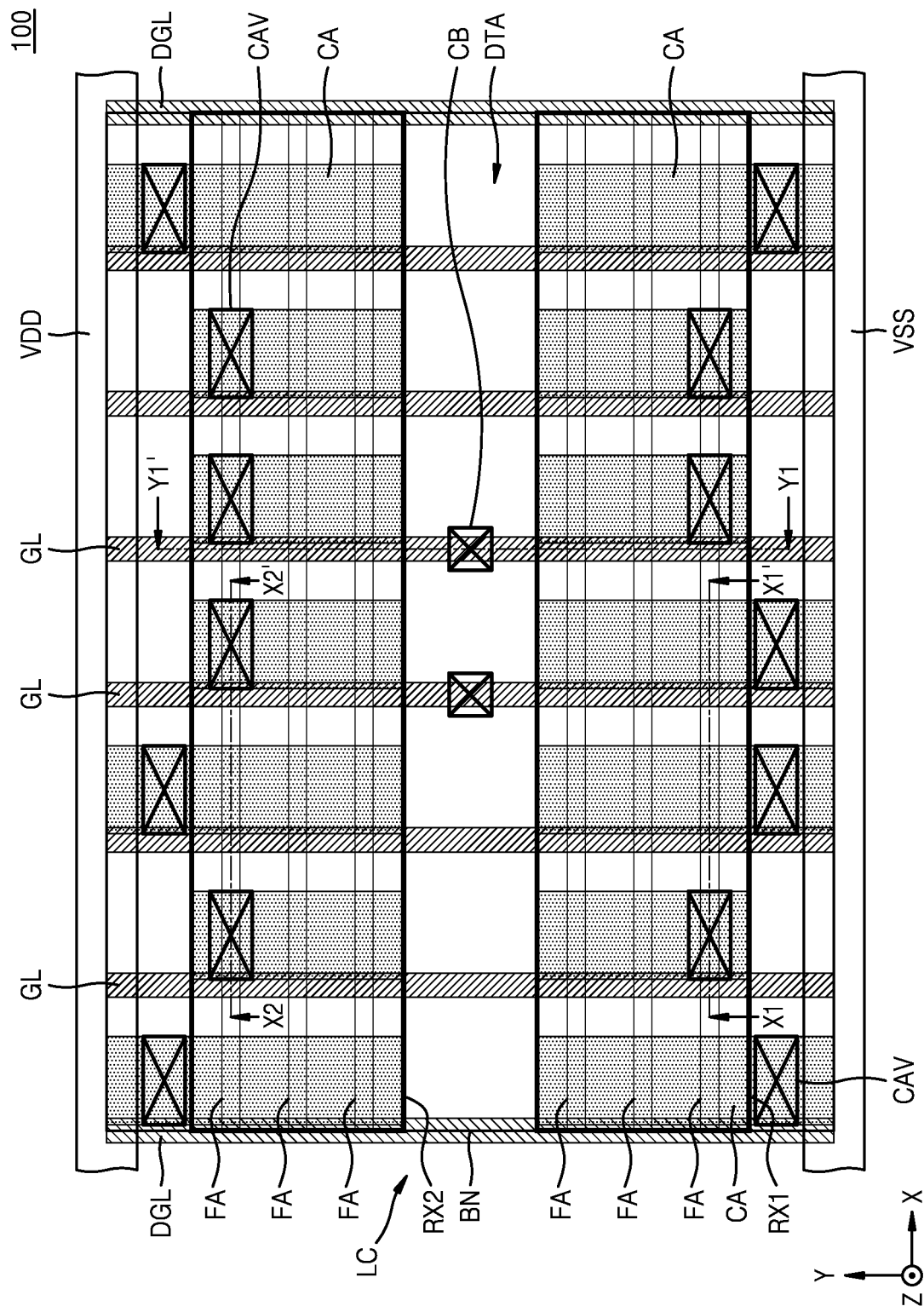
FIG. 1 is a plan layout diagram showing an integrated circuit device according to embodiments of the inventive concept.
Figure 2A:
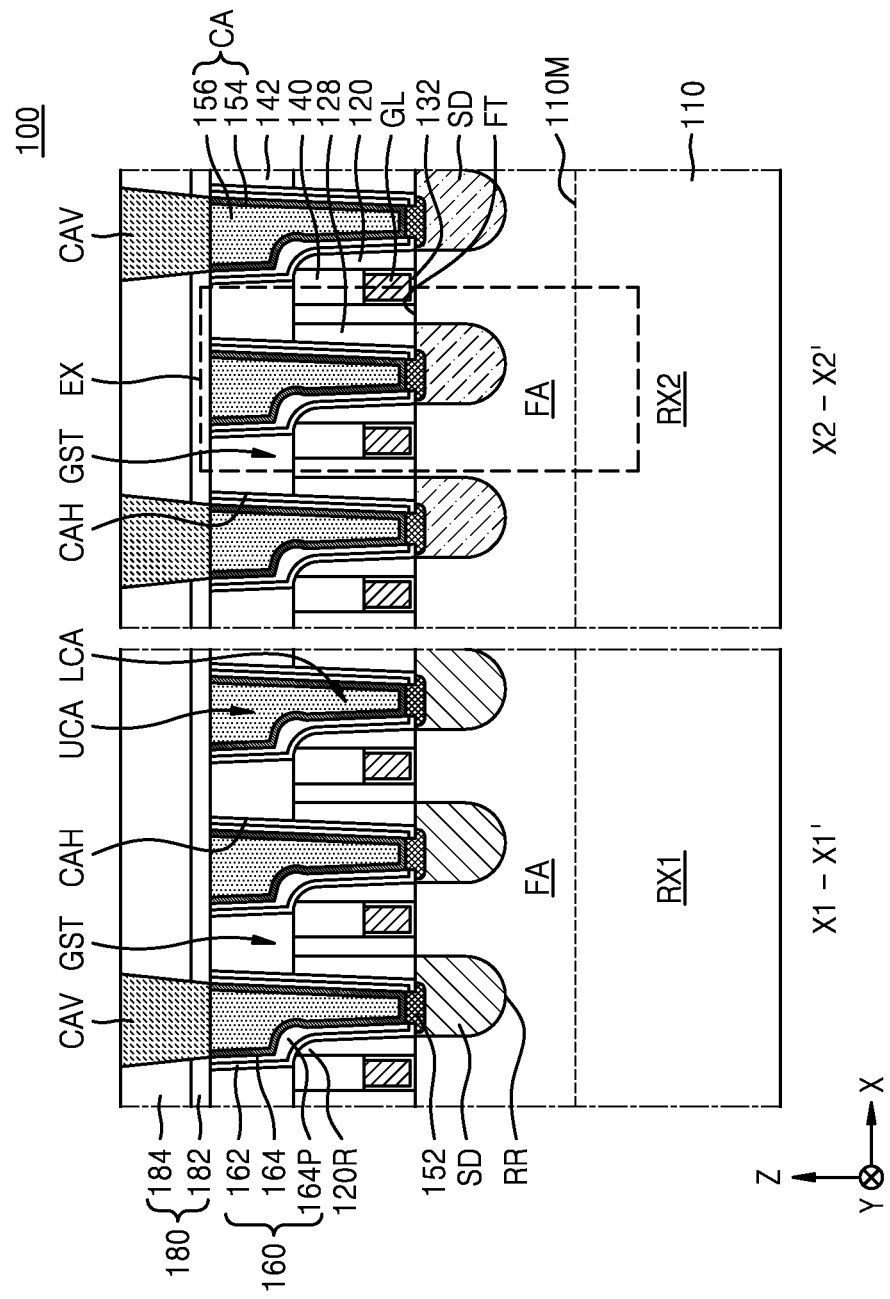
FIG. 2A is a cross-sectional view of partial configurations of a cross-section along a line X1-X1' and a cross-section along a line X2-X2' of FIG. 1.
Figure 2B:
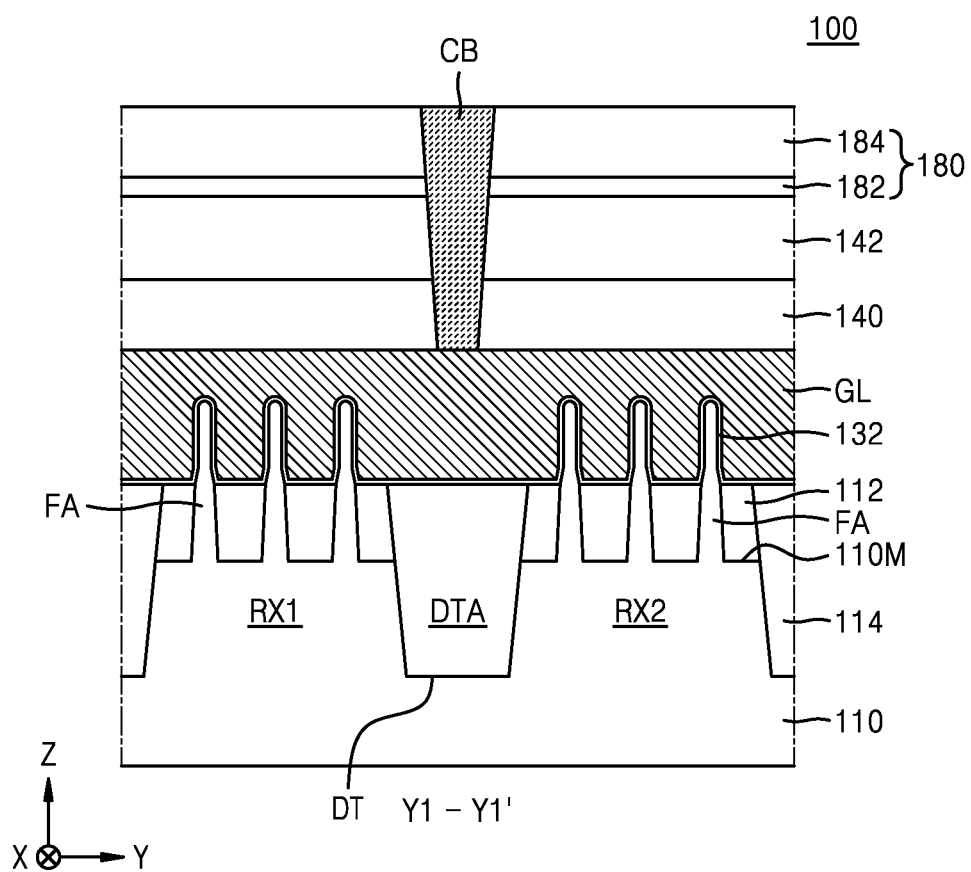
FIG. 2B is a cross-sectional view showing a partial configuration of a cross-section along a line Y1-Y1' of FIG. 1.
Figure 2C:
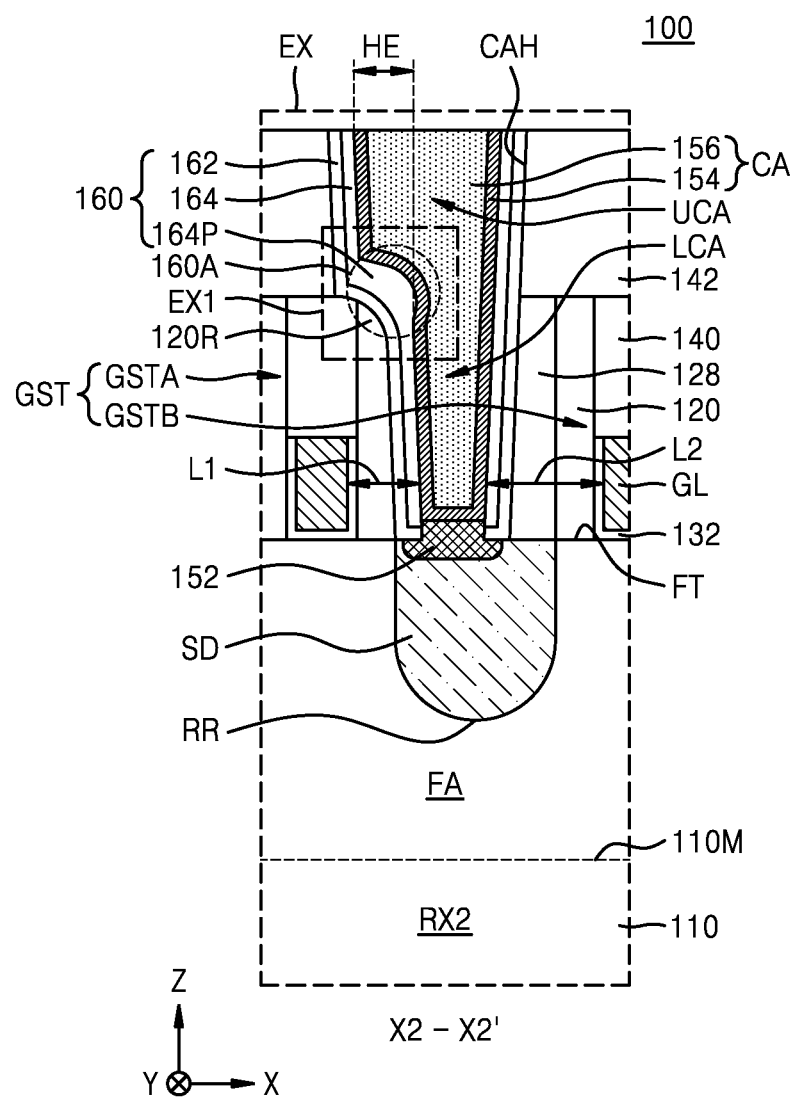
FIG. 2C is an enlarged cross-sectional view of a portion indicated as "EX" in FIG. 2A.
Figure 2D:
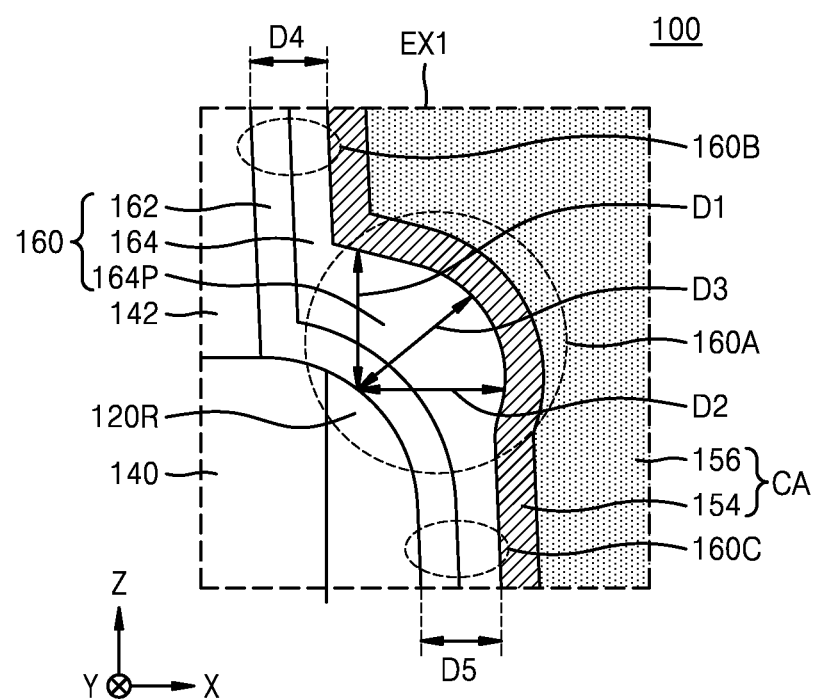
FIG. 2D is an enlarged cross-sectional view of a portion indicated as "EX1" in FIG. 2C.

FIG. 1 is a plan layout diagram showing an integrated circuit device 100 according to embodiments of the inventive concept. FIG. 2A is a cross-sectional view of partial configurations of a cross-section along a line X1-X1' and a cross-section along a line X2-X2' of FIG. 1, FIG. 2B is a cross-sectional view showing a partial configuration of a cross-section along a line Y1-Y1' of FIG. 1, FIG. 2C is an enlarged cross-sectional view of a portion indicated as "EX" in FIG. 2A, and FIG. 2D is an enlarged cross-sectional view of a portion indicated as "EX1" in FIG. 2C.

Referring to FIGS. 1 and 2A to 2D, the integrated circuit device 100 may constitute a logic cell including a fin field effect transistor (FinFET) device. The integrated circuit device 100 includes a logic cell LC formed in a region defined by a cell boundary BN on a substrate 110.

The substrate 110 has a main surface 110M extending in horizontal directions (X-Y plane-wise directions). The substrate 110 may include a semiconductor like Si or Ge or a compound semiconductor like SiGe, SiC, GaAs, InAs, or InP. The substrate 110 may include a conductive region, e.g., a well doped with an impurity or a structure doped with an impurity.

The logic cell LC includes a first device region RX1 and a second device region RX2. The terms "first," "second", etc. may be used herein merely to distinguish one element or region from another. A plurality of fin-type active regions FA protruding from the substrate 110 are formed in the first device region RX1 and the second device region RX2. The fin-type active regions FA may extend parallel to one another in a width-wise direction of the logic cell LC, that is, a first horizontal direction (X direction). Materials constituting the fin-type active regions FA are substantially the same as the above-stated materials constituting the substrate 110.

As shown in FIG. 2B, in the first device region RX1 and the second device region RX2, a device isolation layer 112 may be disposed between the fin-type active regions FA. In the first device region RX1 and the second device region RX2, the fin-type active regions FA may protrude above the device isolation layer 112 in fin-like shapes. An inter-device isolation region DTA may be disposed between the first device region RX1 and the second device region RX2. In the inter-device isolation region DTA, a deep trench DT defining the first device region RX1 and the second device region RX2 is formed, and the deep trench DT may be filled with an inter-device isolating insulation layer 114. The device isolation layer 112 and the inter-device isolating insulation layer 114 may each include an oxide film.

As shown in FIGS. 2A and 2B, on the substrate 110, a plurality of gate insulation layers 132 and a plurality of gate lines GL may extend in the height-wise direction of the logic cell LC, that is, a second direction (Y direction) in which the gate insulation layers 132 and the gate lines GL intersect the fin-type active regions FA. The gate insulation layers 132 and the gate lines GL may cover the top surface and both sidewalls of each of the fin-type active regions FA, the top surface of the device isolation layer 112, and the top surface of the inter-device isolating insulation layer 114. As used herein, terms relating to "covering" or "surrounding" may include partially or completely covering or surrounding.

A plurality of MOS transistors may be formed along the gate lines GL in the first device region RX1 and the second device region RX2. The MOS transistors may each be a MOS transistors having a 3-dimensional structure in which channels are formed on top surfaces and both or opposing sidewalls of the fin-type active regions FA, respectively. In example embodiments, the first device region RX1 may be an NMOS transistor region, and a plurality of NMOS transistors may be formed in portions of the first device region RX1 where the fin-type active regions FA and the gate lines GL intersect each other. The second device region RX2 may be a PMOS transistor region, and a plurality of PMOS transistors may be formed in portions of the second device region RX2 where the fin-type active regions FA and the gate lines GL intersect each other.

As shown in FIG. 1, a non-functional or dummy gate line DGL may extend along the cell boundary BN extending in the second horizontal direction (Y direction). The dummy gate line DGL may include the same material as the gate lines GL. The dummy gate line DGL may maintain an electrically floated state during the operation of the integrated circuit device 100, and thus the dummy gate line DGL may function as an electrical isolation region between the logic cell LC and other logic cells around the logic cell LC. The gate lines GL and the dummy gate lines DGL may have the same width in the first horizontal direction (X direction) and may be arranged at a constant pitch in the first horizontal direction (X direction).

The gate insulation layers 132 may include silicon oxide films, high-k films, or a combination thereof. The high-k film or layer may include a material having a higher dielectric constant than that of a silicon oxide layer. The high-k film may include a metal oxide or a metal oxynitride. An interfacial layer (not shown) may be interposed between the fin-type active region FA and the gate insulation layer 132. The interfacial layer may include an oxide film, a nitride film, or an oxynitride film.

The gate lines GL and the dummy gate lines DGL may each have a structure in which a metal nitride layer, a metal layer, a conductive capping layer, and a gap-fill metal layer are sequentially stacked. The metal nitride layer and the metal layer may include at least one metal selected from Ti, Ta, W, Ru, Nb, Mo, and Hf. The gap-fill metal layer may include a W layer or an Al layer. The gate lines GL and the dummy gate lines DGL may each include a work function metal-containing layer. The work function metal-containing layer may include at least one metal selected from among Ti, W, Ru, Nb, Mo, Hf, Ni, Co, Pt, Yb, Tb, Dy, Er, and Pd. In example embodiments, the gate lines GL and the dummy gate lines DGL may each have a stacked structure of TiAlC/TiN/W, a stacked structure of TiN/TaN/TiAlC/TiN/W, or a stacked structure of TiN/TaN/TiN/TiAlC/TiN/W, but the inventive concept is not limited thereto.

Top surfaces of the gate lines GL, the dummy gate lines DGL, and the gate insulation layers 132 may each be covered with an insulation capping line 140. A plurality of insulation capping lines 140 may include a silicon nitride film.

A plurality of insulation spacers 120 may cover both or opposing sidewalls of the gate lines GL, the dummy gate lines DGL, and the insulation capping lines 140. The insulation capping line 140 and the insulation spacers 120 may each extend in a line shape in the second horizontal direction (Y direction), which is a length-wise direction of the logic cell LC. The insulation spacers 120 may each include silicon nitride (SiN), SiCN, SiBN, SiON, SiOCN, SiBCN, or a combination thereof, but is not limited thereto. The terms "SiN", "SiCN", "SiBN", "SiON", "SiOCN", and "SiBCN" as used herein refer to a material composed of elements included in each term and is not a formula representing a stoichiometric relationship.

One gate line GL, one insulation capping line 140 covering the top surface of the one gate line GL, and the insulation spacer 120 covering the sidewalls of the one gate line GL and the one insulation capping line 140 may constitute one gate structure GST. A plurality of gate structures GST may be arranged on one fin-type active region FA, and the gate structures GST may extend parallel to one another in the second horizontal direction (Y direction).

As shown in FIG. 2A, a plurality of recessed regions RR may be formed on the top surfaces of the fin-type active regions FA. The recessed regions RR may each be disposed between a pair of adjacent gate structures GST from among the gate structures GST. A plurality of source/drain regions SD may be formed in the recessed regions RR. At least some of the source/drain regions SD from among the source/drain regions SD may be interposed between a pair of gate structures GST. The gate line GL included in the gate structures GST and the source/drain region SD adjacent thereto may be spaced apart from each other with the gate insulation layer 132 and the insulation spacer 120 interposed therebetween.

The source/drain regions SD may include semiconductor epitaxial layers epitaxially grown from the recessed regions RR formed in the fin-type active regions FA. The source/drain regions SD may include an epitaxially grown Si layer, an epitaxially grown SiC layer, or a plurality of epitaxially grown SiGe layers. When the first device region RX1 is an NMOS transistor region and the second device region RX2 is a PMOS transistor region, the source/drain regions SD in the first device region RX1 may include a Si layer doped with an n-type dopant or a SiC layer doped with an n-type dopant, and the source/drain regions SD in the second device region RX2 may include a SiGe layer doped with a p-type dopant. The n-type dopant may be selected from among phosphorus(P), arsenic As), and antimony (Sb). The p-type dopant may be selected from between boron(B) and gallium (Ga).

In example embodiments, the source/drain regions SD in the first device region RX1 and the source/drain regions SD in the second device region RX2 may have different shapes and sizes. The shape of each of the source/drain regions SD is not limited to those shown in FIGS. 2A and 2C, and the source/drain regions SD having various shapes and sizes may be formed in the first device region RX1 and the second device region RX2.

A plurality of source/drain contacts CA extend in the vertical direction (Z direction) on the source/drain regions SD. The source/drain contacts CA have asymmetric shapes on both or opposing sides in the first horizontal direction (X direction). That is, the opposing sides of the source/drain contacts CA in the first horizontal (X) direction may be asymmetric about an axis in the vertical (Z) direction.

A plurality of metal silicide layers 152 may be interposed between the source/drain regions SD and the source/drain contacts CA. The metal silicide layers 152 may each cover at least a portion of the top surface of the source/drain region SD. The metal silicide layers 152 may each have the bottom surface in contact with the source/drain region SD and the top surface in contact with the source/drain contact CA. The source/drain contacts CA may be connected to the source/drain regions SD through the metal silicide layers 152, respectively. The source/drain regions SD may be connected to upper conductive lines (not shown) through the metal silicide layer 152 and the source/drain contact CA, respectively.

The metal silicide layer 152 and the source/drain contact CA that are interposed between a pair of gate structures GST adjacent to each other and are connected to each other may be arranged to be closer to one gate structure GST selected from between the pair of gate structures GST in the first direction (X direction).

As shown in FIG. 2C, the pair of gate structures GST may include a first gate structure GSTA disposed at a location relatively close to the source/drain contact CA between the pair of gate structures GST and a second gate structure GSTB disposed at a location relatively far from the source/drain contact CA. In the first horizontal direction (X direction), a distance from the source/drain contact CA to the first gate structure GSTA may be smaller than a distance from the source/drain contact CA to the second gate structure GSTB. Also, in the first horizontal direction (X direction), a first distance L1 from the source/drain contact CA to the gate line GL included in the first gate structure GSTA may be smaller than a second distance L2 from the source/drain contact CA to the gate line GL included in the second gate structure GSTB.

As shown in FIG. 2C, in the first horizontal direction (X direction), a distance from the metal silicide layer 152 interposed between the pair of gate structures GST to the first gate structure GSTA may be smaller than a distance from the metal silicide layer 152 to the second gate structure GSTB.

In example embodiments, the metal silicide layers 152 may include Ti, W, Ru, Nb, Mo, Hf, Ni, Co, Pt, Yb, Tb, Dy, Er, or Pd. For example, the metal silicide layer 152 may include titanium silicide.

The source/drain contacts CA may be spaced apart from the gate structure GST in the first direction (X direction) with the insulation spacers 120 therebetween. As shown in FIG. 2C, an inter-gate insulation layer 128 may be interposed between the source/drain contact CA and the second gate structure GSTB adjacent thereto. In example embodiments, the inter-gate insulation layer 128 may not be interposed between the source/drain contact CA and the first gate structure GSTA adjacent thereto. The inter-gate insulation layer 128 may include a silicon oxide film, but is not limited thereto.

The source/drain contacts CA may each include a conductive barrier layer 154 and a metal plug 156. The conductive barrier layer 154 may surround the outer surface of the metal plug 156. The conductive barrier layer 154 may include Ti, Ta, TiN, TaN, or a combination thereof, and the metal plug 156 may include W, Co, Cu, Ru, Mn, or a combination thereof. However, the inventive concept is not limited thereto.

The top surface of each of the gate structures GST may be covered by a top insulation layer 142. A plurality of source/drain contact holes CAH through which the source/drain contacts CA pass may be formed in the top insulation layer 142.

Sidewalls of each of the source/drain contacts CA may be surrounded by an insulation liner 160. The source/drain contacts CA and the insulation liner 160 may extend long by penetrating the source/drain contact holes CAH in the vertical direction (Z direction).

The insulation liner 160 may have a multilayer structure including a first insulation liner 162 and a second insulation liner 164. The first insulation liner 162 and the second insulation liner 164 may sequentially cover the gate structures GST. The first insulation liner 162 may contact the insulation spacer 120 included in the first gate structure GSTA and cover the outermost inner wall of the source/drain contact holes CAH. The second insulation liner 164 may be interposed between the first insulation liner 162 and the source/drain contact CA and may contact the conductive barrier layer 154 of the source/drain contact CA.

The first insulation liner 162 may have a constant or substantially uniform thickness according to its position within the source/drain contact hole CAH and may cover the outermost inner wall of the source/drain contact hole CAH with a uniform thickness. The second insulation liner 164 may have a variable or non-uniform thickness according to its position within the source/drain contact hole CAH.

The source/drain contacts CA may each include a lower contact portion LCA and an upper contact portion UCA overlapping each other in the vertical direction (Z direction). The lower contact portion LCA and the upper contact portion UCA may be integrally connected to or integral to each other. As used herein, elements that are integral or integrally connected to one another may be portions of a same layer or structure. The conductive barrier layer 154 constituting the lower contact portion LCA may be integrally connected to or integral to the conductive barrier layer 154 constituting the upper contact portion UCA, and the metal plug 156 constituting the lower contact portion LCA may be integrally connected to or integral to the metal plug 156 constituting the upper contact portion UCA. In the first horizontal direction (X direction), the width of the upper contact portion UCA of the source/drain contact CA may be greater than the width of the lower contact portion LCA.

Referring to FIG. 2C, the lower contact portion LCA of the source/drain contact CA may face the first gate structure GSTA and the second gate structure GSTB in the first horizontal direction (X direction). The upper contact portion UCA may include a horizontal extension HE, which covers an upper corner of the first gate structure GSTA adjacent to the source/drain contact CA and overlaps at least a portion of the first gate structure GSTA in the vertical direction (Z direction). The horizontal extension HE may have a shape extending in the first horizontal direction (X direction) from the top end of the lower contact portion LCA toward the first gate structure GSTA.

The height of the top surface of at least a portion of the insulation spacer 120 included in the first gate structure GSTA may be smaller than the height of the top surface of the insulation spacer 120 included in the second gate structure GSTB. In example embodiments, a top portion 120R of the insulation spacer 120 that is included in the first gate structure GSTA and adjacent to the source/drain contact CA may constitute a portion of the upper corner of the first gate structure GSTA adjacent to the source/drain contact CA. At least a portion of the top surface of the top portion 120R of the insulation spacer 120 included in the first gate structure GSTA may be at a level lower than that of the topmost surface level of the insulation spacer 120 included in the second gate structure GSTB. The term "level" as used herein refers to a height in a vertical direction (Z direction or –Z direction) from the top surface of the substrate 102.

At least a portion of the top surface of the top portion 120R of the insulation spacer 120 included in the first gate structure GSTA may be at a level lower than that of the topmost surface level of another portion of the insulation spacer 120 included in the first gate structure GSTA. At least a portion of the top surface of the top portion 120R of the insulation spacer 120 included in the first gate structure GSTA may be at a level lower than that of the topmost surface level of the first gate structure GSTA. Therefore, the respective shapes of both or opposing sides of the first gate structure GSTA may be asymmetric in the first direction (X direction), that is, asymmetric about an axis in the vertical direction (Z direction).

The top portion 120R of the insulation spacer 120 included in the first gate structure GSTA may overlap the horizontal extension HE included in the upper contact portion UCA of the source/drain contact CA in the vertical direction (Z direction). As shown in FIG. 2C, the source/drain contact CA interposed between the first gate structure GSTA and the second gate structure GSTB may not cover the top surface of the second gate structure GSTB. In other words, the source/drain contact CA interposed between the first gate structure GSTA and the second gate structure GSTB may not include a portion overlapping the second gate structure GSTB in the vertical direction (Z direction).

The insulation liner 160 may include a first local region 160A having a relatively large thickness. The first local region 160A may be a portion interposed between the upper corner including the top portion 120R of the insulation spacer 120 of the first gate structure GSTA and the horizontal extension HE of the source/drain contact CA.

FIG. 2D is an enlarged cross-sectional view of a portion indicated as "EX1" in FIG. 2C. In FIG. 2D, a portion including the first local region 160A of the insulation liner 160 and some of components around the portion are shown.

Referring to FIG. 2D, the first local region 160A of the insulation liner 160 may be a portion interposed between the top portion 120R of the insulation spacer 120 included in the first gate structure GSTA and the source/drain contact CA. One side of the top portion 120R of the insulation spacer 120 included in the first gate structure GSTA may contact the first local region 160A of the insulation liner 160, and the other (e.g., opposing) side of the first local region 160A of the insulation liner 160 may contact the conductive barrier layer 154 included in the source/drain contact CA.

As shown in FIG. 2D, thicknesses D1, D2, and D3 of the first local region 160A of the insulation liner 160 may each be greater than a thickness D4 of a local portion farther from the substrate 110 than the first local region 160A, e.g., a second local region 160B. Also, the thicknesses D1, D2, and D3 of the first local region 160A of the insulation liner 160 may each be greater than a thickness D5 of a local portion closer to the substrate 110 than the first local region 160A, e.g., a third local region 160C. The thicknesses D1, D2, and D3 of the first local region 160A may include a thickness D1 of the first local region 160A in the vertical direction (Z direction), a thickness D2 of the first local region 160A in the first direction (X direction), and a thickness D3 of the first local region 160A in a diagonal direction between the first direction (X direction) and the vertical direction (Z direction). The second local region 160B of the insulation liner 160 may include a portion of the insulation liner 160 interposed between the top insulation layer 142 and the upper contact portion UCA of the source/drain contact CA. The third local region 160C of the insulation liner 160 may include a portion of the insulation liner 160 interposed between the sidewall of the first gate structure GSTA and the lower contact portion LCA of the source/drain contact CA. The third local region 160C of the insulation liner 160 may include a portion of the insulation liner 160 interposed between the gate line GL included in the first gate structure GSTA and the gate line GL included in the second gate structure GSTB.

In the insulation liner 160, the first insulation liner 162 may include a portion in contact with the upper corner of the first gate structure GSTA, and the second insulation liner 164 may include a portion in contact with the horizontal extension HE of the source/drain contact CA.

In example embodiments, the first insulation liner 162 may have substantially the same thickness in the first local region 160A, the second local region 160B, and the second local region 160C of the insulation liner 160. In example embodiments, the second insulation liner 164 may include a protecting portion 164P having a variable or non-uniform thickness according to a position, and having the largest thickness in the first local region 160A of the insulation liner 160. The protecting portion 164P of the second insulation liner 164 may protect the upper corner of the first gate structure GSTA during a process of manufacturing the integrated circuit device 100, thereby reducing or preventing unwanted short circuits or parasitic capacitance between the gate line GL included in the first gate structure GSTA and the source/drain contact CA.

The insulation liner 160 may include portions respectively contacting the source/drain region SD and the metal silicide layer 152 and portions contacting the top insulation layer 142.

In example embodiments, the first insulation liner 162 and the second insulation liner 164 of the insulation liner 160 may each include a silicon nitride film. In example embodiments, a silicon nitride film constituting the first insulation liner 162 and a silicon nitride film constituting the second insulation liner 164 may have different densities. To obtain such a structure, the first insulation liner 162 and the second insulation liner 164 may be formed by different deposition methods. For example, the first insulation liner 162 may include a silicon nitride film formed through an atomic layer deposition (ALD) process, and the second insulation liner 164 may include a silicon nitride film formed through a plasma enhanced chemical vapor deposition (PECVD) process or a physical vapor deposition (PVD) process. More detailed descriptions of methods of forming the first insulation liner 162 and the second insulation liner 164 will be given later with reference to FIGS. 11G and 11H.

In other example embodiments, the first insulation liner 162 and the second insulation liner 164 may each include silicon nitride (SiN), SiCN, SiBN, SiON, SiOCN, SiBCN, or a combination thereof, but the inventive concept is not limited thereto.

Although FIGS. 2A, 2C, and 2D show a case in which the insulation liner 160 has a double-layer structure including the first insulation liner 162 and the second insulation liner 164 that sequentially cover the sidewalls of the insulation spacer 120, the inventive concept is not limited thereto. For example, the insulation liner 160 may include a single layer or multiple layers including at least a triple layer.

As shown in FIG. 2C, the first gate structure GSTA may contact the insulation liner 160 in the first horizontal direction (X direction). The second gate structure GSTB may be spaced apart from the insulation liner 160 in the first horizontal direction (X direction) with the inter-gate insulation layer 128 therebetween.

As shown in FIGS. 2A and 2B, the top insulation layer 142, the source/drain contacts CA, and a plurality of insulation liners 160 may be covered by an insulation structure 180. The insulation structure 180 may include an etch stop layer 182 and an interlayer insulation layer 184 that are sequentially stacked on the source/drain contact CA and the top insulation layer 142. The etch stop layer 182 may include silicon carbide (SiC), SiN, nitrogen-doped silicon carbide (SiC:N), SiOC, AlN, AlON, AlO, AlOC, or a combination thereof. The interlayer insulation layer 184 may include an oxide film, a nitride film, an ultra low-k (ULK) film having an ultra low dielectric constant K from about 2.2 to about 2.4, or a combination thereof. For example, the interlayer insulation layer 184 may include a tetraethylorthosilicate (TEOS) film, a high density plasma (HDP) oxide film, a boro-phospho-silicate glass (BPSG) film, a flowable chemical vapor deposition (FCVD) oxide film, a SiON film, a SiN film, a SiOC film, a SiCOH film, or a combination thereof, but is not limited thereto.

A plurality of via contacts CAV may be formed on the source/drain contacts CA. The via contacts CAV may penetrate through the insulation structure 180 and contact the source/drain contacts CA, respectively.

As shown in FIGS. 1 and 2B, a plurality of gate contacts CB may be formed on the gate lines GL. The gate contacts CB may penetrate through the insulation structure 180, the top insulation layer 142, and the insulation capping line 140 and contact the top surfaces of the gate lines GL, respectively.

The via contacts CAV and the gate contacts CB may each include a buried metal film and a conductive barrier layer surrounding the buried metal film. The buried metal film may include Co, Cu, W, Ru, Mn, or a combination thereof, and the conductive barrier layer may include Ti, Ta, TiN, TaN, or a combination thereof. Sidewalls of the via contacts CAV and the gate contacts CB may be covered by an upper insulation liner (not shown). The upper insulation liner may include a silicon nitride film, but is not limited thereto.

As shown in FIG. 1, in the logic cell LC, a ground line VSS may be connected to the fin-type active region FA in the first device region RX1 through the source/drain contact CA in the first device region RX1 from among the source/drain contacts CA, and a power line VDD may be connected to the fin-type active region FA in the second device region RX2 through the source/drain contact CA in the second device region RX2 from among the source/drain contacts CA. The ground line VSS and the power line VDD may be formed at a level higher than those of the top surfaces of the source/drain contacts CA and the gate contacts CB. The ground line VSS and the power line VDD may each include a conductive barrier layer and a conductive layer for wires. The conductive barrier layer may include Ti, Ta, TiN, TaN, or a combination thereof. The conductive layer for wires may include Co, Cu, W, an alloy thereof, or a combination thereof.

The integrated circuit device 100 shown in FIGS. 1 and 2A to 2D may include the insulation liner 160 having a variable or non-uniform thickness according to a location, and the second insulation liner 164 included in the insulation liner 160 may include the protecting portion 164P having a variable or non-uniform thickness according to a location and having the largest thickness in the first local region 160A of the insulation liner 160. The protecting portion 164P of the second insulation liner 164 may protect the upper corner of the first gate structure GSTA during a process of manufacturing the integrated circuit device 100, thereby reducing or preventing unwanted short circuits or parasitic capacitance between the gate line GL included in the first gate structure GSTA and the source/drain contact CA. Therefore, in the integrated circuit device 100, an insulation distance between the gate line GL and a contact structure adjacent thereto, e.g., the source/drain contact CA, may be stably secured, and electrical properties and reliability of the integrated circuit device 100 may be improved.

Figure 3:
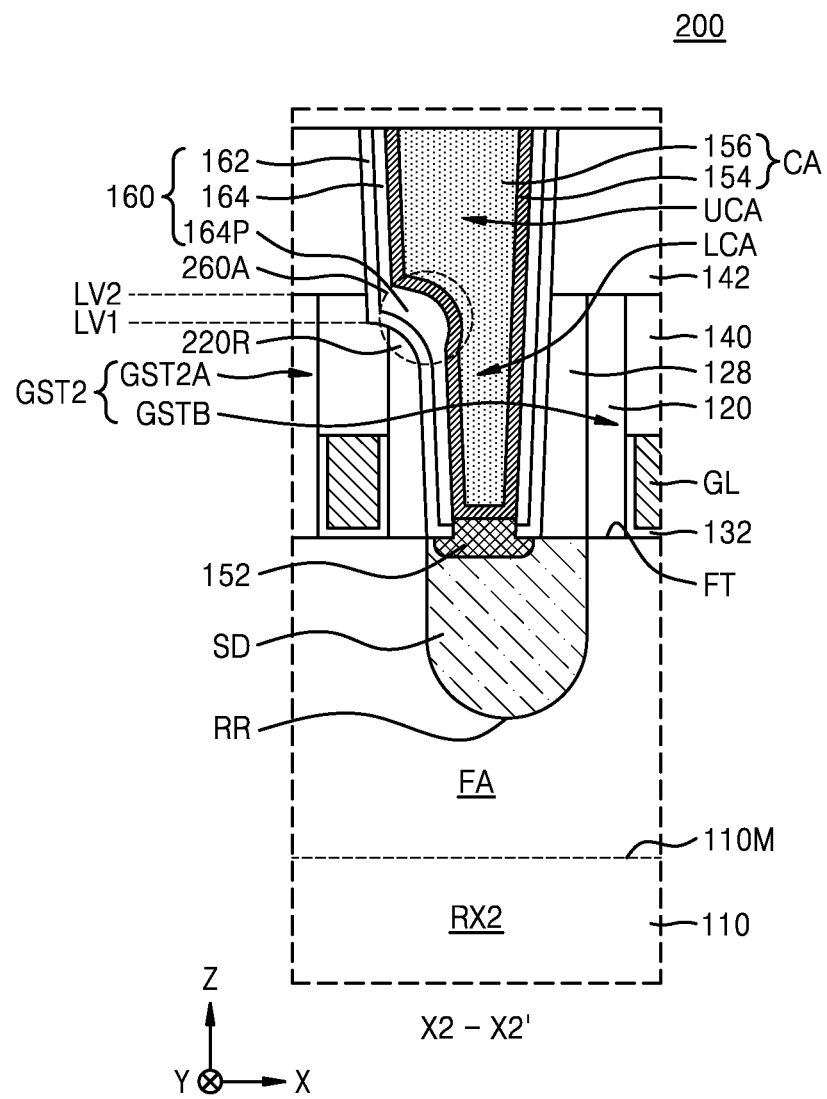
FIG. 3 is a cross-sectional diagram illustrating an integrated circuit device according to some other embodiments of the inventive concept.

FIG. 3 is a cross-sectional diagram for describing an integrated circuit device 200 according to some other embodiments of the inventive concept. FIG. 3 shows an enlarged view of a portion of the integrated circuit device 200 corresponding to the portion indicated by "EX" in FIG. 2A in a region corresponding to a cross-section along the line X2-X2' of FIG. 1.

Referring to FIG. 3, the integrated circuit device 200 may have substantially the same configuration as the integrated circuit device 100 described above with reference to FIGS. 1 and 2A to 2D. The integrated circuit device 200 may include the first device region RX1 and the second device region RX2 similar to the integrated circuit device 100 described above with reference to FIGS. 1 and 2A to 2D. Although some components of the second device region RX2 of the integrated circuit device 200 are shown in FIG. 3, the first device region RX1 may also have the same or similar components as described later.

However, unlike the integrated circuit device 100 described above with reference to FIGS. 1 and 2A to 2D, the integrated circuit device 200 includes a plurality of gate structures GST2. Similar to the gate structures GST described above with reference to FIGS. 2A and 2C, the gate structures GST2 include a pair of gate structures GST2 adjacent to each other, and the pair of gate structures GST2 include a first gate structure GST2A disposed at a location relatively close to the source/drain contact CA interposed between the pair of gate structures GST2 in the first direction (X direction) and a second gate structure GSTB disposed at a location relatively far from the source/drain contact CA.

The first gate structure (GST2A) may have a configuration substantially similar to that described above for the first gate structure GSTA with reference to FIGS. 2A and 2C. However, the topmost level LV1 of a top portion 220R of the insulation spacer 120 included in the first gate structure GST2A adjacent to the source/drain contact CA is lower than the topmost level LV2 of the first gate structure GST2A. A first local region 260A of the insulation liner 160 having a relatively large thickness may be in contact with the top portion 220R of the insulation spacer 120.

Similar to the integrated circuit device 100 described above with reference to FIGS. 1 and 2A to 2D, the integrated circuit device 200 described with reference to FIG. 3 includes the insulation liner 160 having a variable or non-uniform thickness according to a location, and the second insulation liner 164 included in the insulation liner 160 includes the protecting portion 164P having a variable or non-uniform thickness according to a location and having the largest thickness in the first local region 260A of the insulation liner 160. The protecting portion 164P of the second insulation liner 164 may protect the upper corner of the first gate structure GST2A during a process of manufacturing the integrated circuit device 100, thereby reducing or preventing unwanted short circuits or parasitic capacitance between the gate line GL included in the first gate structure GST2A and the source/drain contact CA. Therefore, in the integrated circuit device 200, an insulation distance between the gate line GL and a contact structure adjacent thereto, e.g., the source/drain contact CA, may be stably secured, and electrical properties and reliability of the integrated circuit device 200 may be improved.

Figure 4:
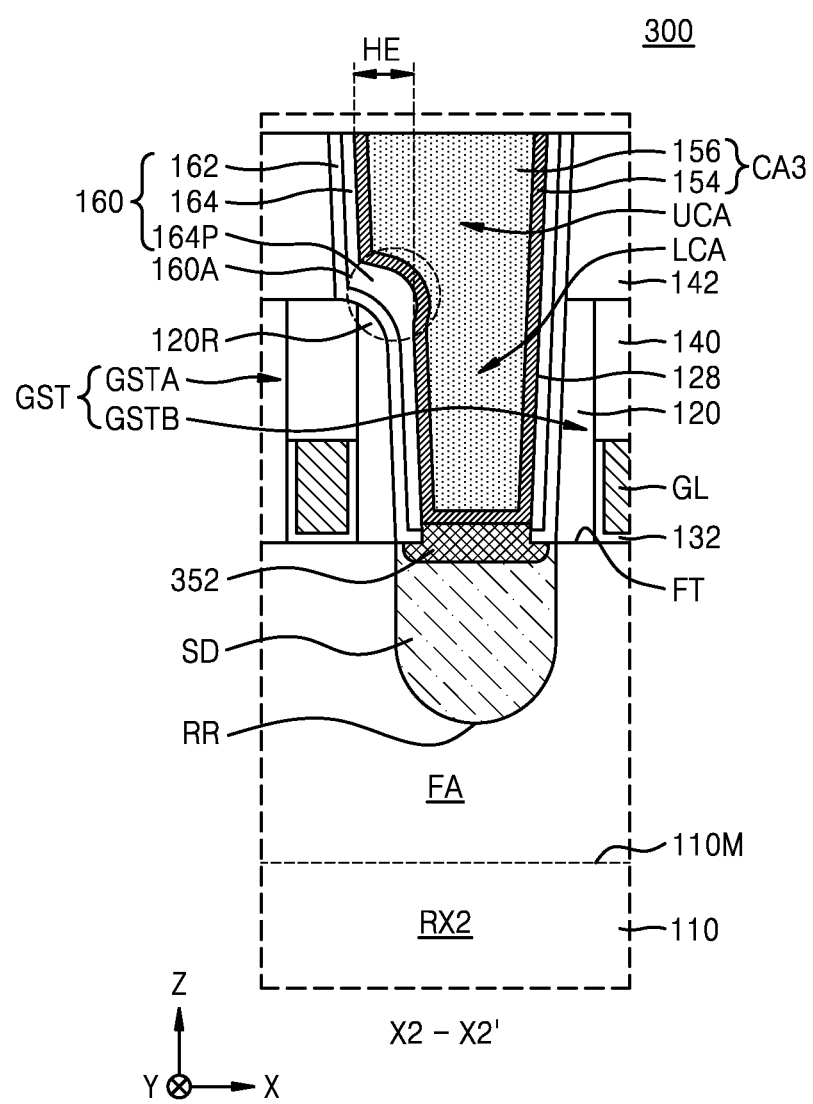
FIG. 4 is a cross-sectional diagram illustrating an integrated circuit device according to some other embodiment of the inventive concept.

FIG. 4 is a cross-sectional diagram for describing an integrated circuit device 300 according to some other embodiment of the inventive concept. FIG. 4 shows an enlarged view of a portion of the integrated circuit device 300 corresponding to the portion indicated by "EX" in FIG. 2A in a region corresponding to a cross-section along the line X2-X2' of FIG. 1.

Referring to FIG. 4, the integrated circuit device 300 may have substantially the same configuration as the integrated circuit device 100 described above with reference to FIGS. 1 and 2A to 2D. The integrated circuit device 300 may include the first device region RX1 and the second device region RX2 similar to the integrated circuit device 100 described above with reference to FIGS. 1 and 2A to 2D. Although some components of the second device region RX2 of the integrated circuit device 300 are shown in FIG. 4, the first device region RX1 may also have the same or similar components as described later. However, the integrated circuit device 300 may include a metal silicide layer 352 and a source/drain contact CA3 instead of the metal silicide layer 152 and source/drain contact CA described above with reference to FIGS. 2A to 2C. The metal silicide layer 352 and the source/drain contact CA3 may have substantially the same configurations as those described for the metal silicide layer 152 and the source/drain contact CA described above with reference to FIGS. 2A to 2C. However, the metal silicide layer 352 and the source/drain contact CA3 may each be disposed at an approximately middle location between a pair of gate structures GST on both or opposing sides of the metal silicide layer 352 and the source/drain contact CA3. Therefore, distances from the source/drain contact CA3 to the pair of gate structures GST on both or opposing sides of the source/drain contact CA3 in the first direction (X direction) may be the same or similar.

The insulation liner 160, which surrounds the sidewalls of the source/drain contact CA3, may contact the insulation spacer 120 included in the first gate structure GSTA and the insulation spacer 120 included in the second gate structure GSTB. The inter-gate insulation layer 128 may not be interposed between the insulation spacer 120 and the insulation liner 160 around the lower contact portion LCA of the source/drain contact CA3.

Similar to the integrated circuit device 100 described above with reference to FIGS. 1 and 2A to 2D, the integrated circuit device 300 described with reference to FIG. 4 includes the insulation liner 160 having a variable or non-uniform thickness according to a location, and the second insulation liner 164 included in the insulation liner 160 includes the protecting portion 164P having a variable or non-uniform thickness according to a location and having the largest thickness in the first local region 160A of the insulation liner 160. The protecting portion 164P of the second insulation liner 164 may protect the upper corner of the first gate structure GSTA during a process of manufacturing the integrated circuit device 100, thereby reducing or preventing unwanted short circuits or parasitic capacitance between the gate line GL included in the first gate structure GSTA and the source/drain contact CA3. Therefore, in the integrated circuit device 300, an insulation distance between the gate line GL and a contact structure adjacent thereto, e.g., the source/drain contact CA3, may be stably secured, and electrical properties and reliability of the integrated circuit device 300 may be improved.

Figure 5:
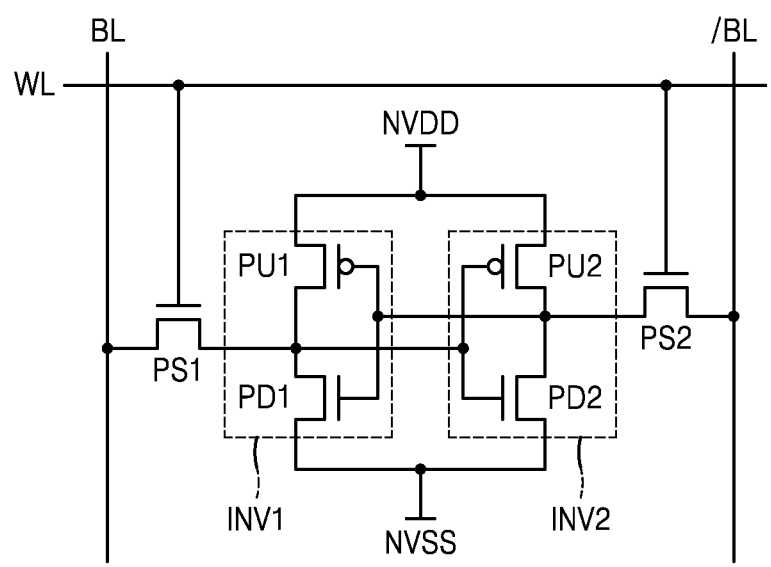
FIG. 5 is a cross-sectional diagram illustrating an integrated circuit device according to some other embodiment of the inventive concept.

FIG. 5 is a cross-sectional diagram for describing an integrated circuit device 400 according to some other embodiment of the inventive concept. FIG. 5 shows a circuit diagram of a 6T static random access memory (SRAM) cell including six transistors.

Referring to FIG. 5, the integrated circuit device 400 may include a pair of inverters including a first inverter INV1 and a second inverter INV2 connected in parallel between a power node NVDD and a ground node NVSS and a first pass transistor PS1 and a second pass transistor PS2 respectively connected to output nodes of the first inverter INV1 and the second inverter INV2. The first pass transistor PS1 and the second pass transistor PS2 may be connected to a bit line BL and a complementary bit line/BL, respectively. Gates of the first pass transistor PS1 and the second pass transistor PS2 may be connected to a word line WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first pull-up transistor PU1 and the second pull-up transistor PU2 may include PMOS transistors, and the first pull-down transistor PD1 and the second pull-down transistor PD2 may include NMOS transistors.

For the first inverter INV1 and second inverter INV2 to constitute one latch circuit, an input node of the first inverter INV1 may be connected to the output node of the second inverter INV2, and an input node of the second inverter INV2 may be connected to the output node of the first inverter INV1.

Figure 6:
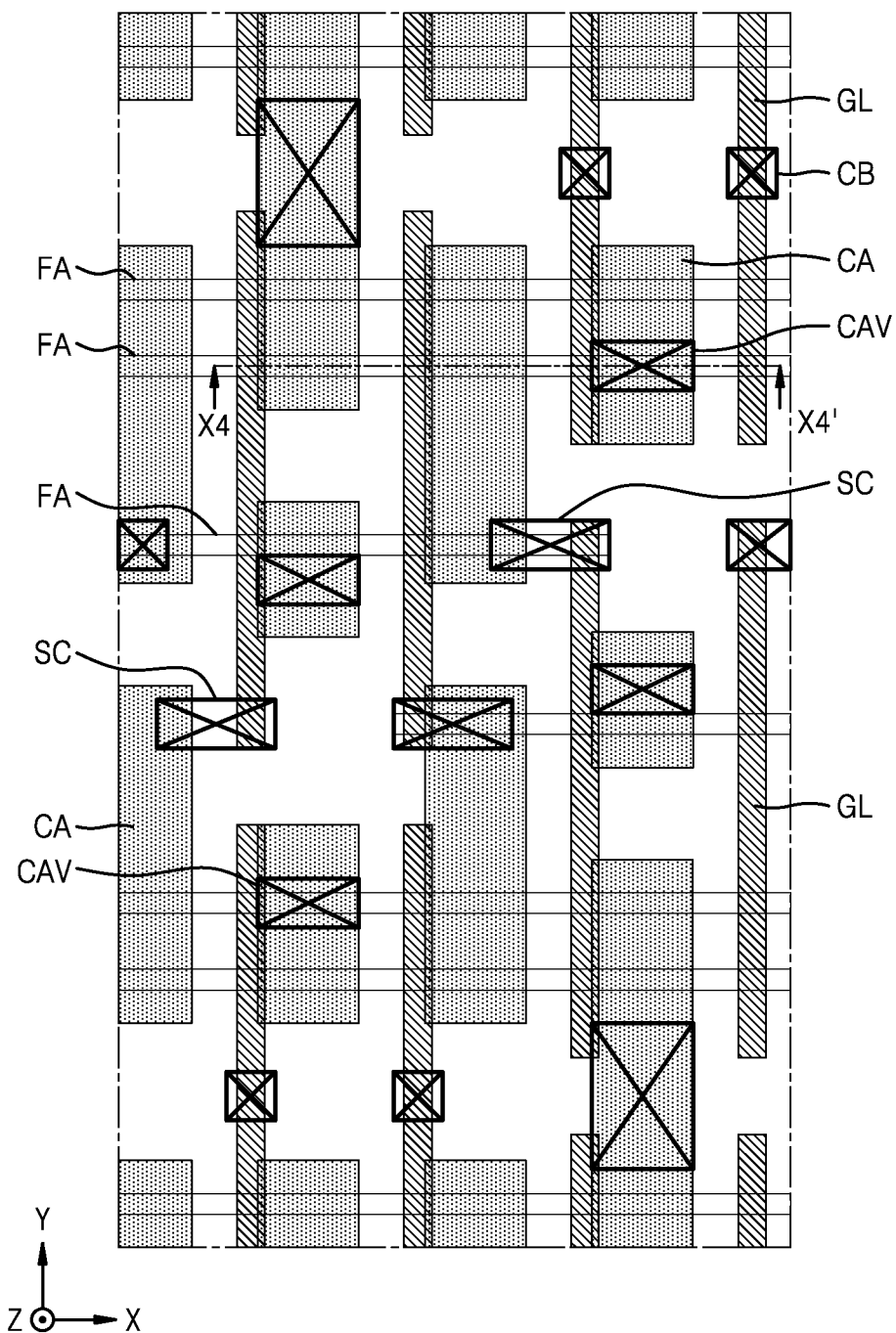
FIG. 6 is a plan layout diagram illustrating the integrated circuit device shown in FIG. 5 in more detail.
Figure 7:
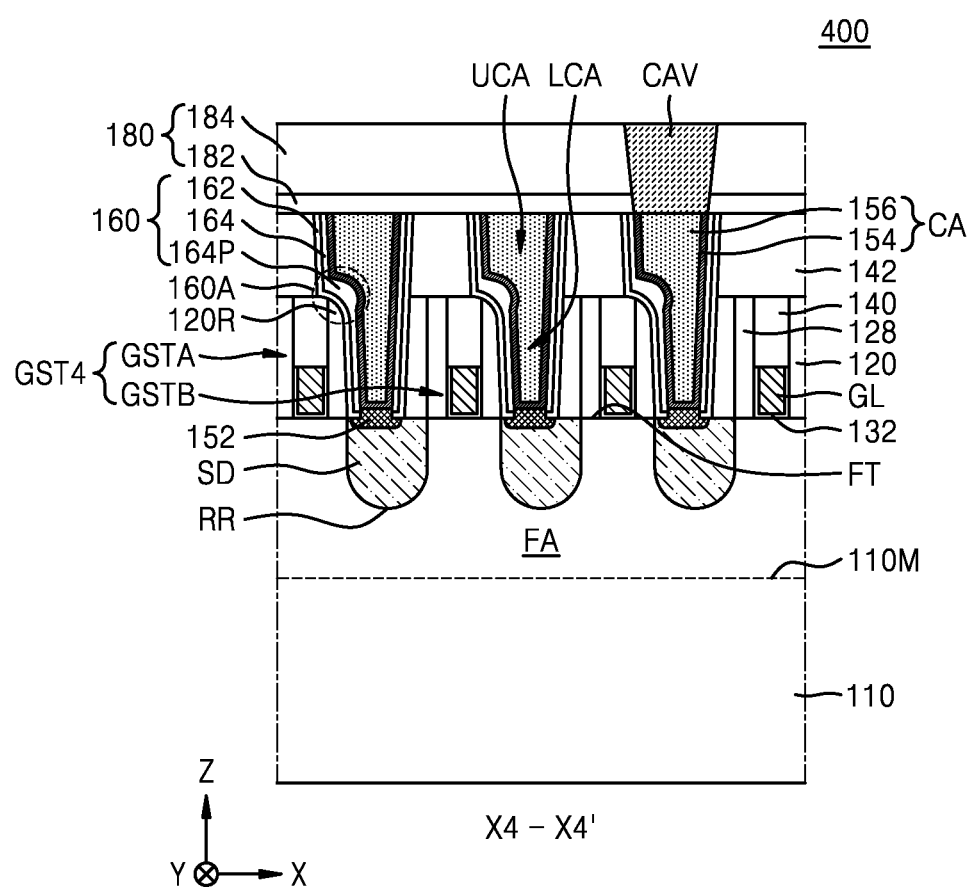
FIG. 7 is a cross-sectional view taken along a line X4-X4' of FIG. 6.

FIG. 6 is a plan layout diagram for describing the integrated circuit device 400 shown in FIG. 5 in more detail. FIG. 7 is a cross-sectional view taken along a line X4-X4' of FIG. 6. In FIGS. 6 and 7, the same reference numerals as those in FIGS. 1 and 2A to 2D denote the same elements or members, and detailed descriptions thereof will be omitted below. The integrated circuit device 400 shown in FIGS. 6 and 7 may include an SRAM array including a plurality of SRAM cells arranged in rows and columns on the substrate 110. The SRAM cells may have the circuit configuration shown in FIG. 5.

Referring to FIGS. 6 and 7, the integrated circuit device 400 includes a plurality of fin-type active regions FA extending parallel to one another in the first horizontal direction (X direction) and a plurality of gate lines GL extending parallel to one another on the fin-type active regions FA in the second direction (Y direction).

Transistors may be formed or defined at intersections between the fin-type active regions FA and the gate lines GL, respectively. The SRAM cells included in the integrated circuit device 400 may each include the first pull-up transistor PU1, the first pull-down transistor PD1, the first pass transistor PS1, the second pull-up transistor PU2, the second pull-down transistor PD2, and the second pass transistor PS2 shown in FIG. 5. The first pull-up transistor PU1 and the second pull-up transistor PU2 may include PMOS transistors, and the first pull-down transistor PD1, the second pull-down transistor PD2, the first pass transistor PS1, and the second pass transistor PS2 may include NMOS transistors. The integrated circuit device 400 may include a plurality of shared contacts SC for connecting the gate line GL and the source/drain region SD in common.

As shown in FIG. 7, in the integrated circuit device 400, a plurality of source/drain regions SD may each be covered with the metal silicide layer 152, and the source/drain contact CA may be formed on the metal silicide layer 152.

In the integrated circuit device 400, one gate line GL, one insulation capping line 140 covering the top surface of the one gate line GL, and the insulation spacer 120 covering the sidewalls of the one gate line GL and the one insulation capping line 140 may constitute one gate structure GST4. A plurality of gate structures GST4 may be arranged on one fin-type active region FA, and the gate structures GST4 may extend parallel to one another in the second horizontal direction (Y direction). The gate structures GST4 may have a configuration substantially same as that described above for the gate structures GST with reference to FIGS. 2A and 2C.

The gate structures GST4 include a pair of gate structures GST4 adjacent to each other, and the pair of gate structures GST4 include a first gate structure GSTA disposed at a location relatively close to the source/drain contact CA interposed between the pair of gate structures GST4 in the first direction (X direction) and a second gate structure GSTB disposed at a location relatively far from the source/drain contact CA. Sidewalls of the source/drain contact CA is surrounded by the insulation liner 160.

A portion of the insulation spacer 120 included in the first gate structure GSTA adjacent to the source/drain contact CA includes the top portion 120R at a level lower than those of the other portions of the insulation spacer 120. At least a portion of the top surface of the top portion 120R may be at a level lower than those of the topmost surface levels of the other portion of the insulation spacer 120 included in the first gate structure GSTA. At least a portion of the top surface of the top portion 120R of the insulation spacer 120 included in the first gate structure GSTA may be at a level lower than that of the topmost surface level of the first gate structure GSTA. Therefore, the respective shapes of both or opposing sides of the first gate structure GSTA may be asymmetric in the first direction (X direction). A first local region 160A of the insulation liner 160 having a relatively large thickness may be in contact with the top portion 120R of the insulation spacer 120.

More detailed configurations of the first gate structure GSTA, the second gate structure GSTB, the source/drain contact CA, the insulation spacer 120, and the insulation liner 160 may be similar or identical to those described above with reference to FIGS. 2A to 2D.

Similar to the integrated circuit device 100 described above with reference to FIGS. 1 and 2A to 2D, the integrated circuit device 400 shown in FIGS. 6 and 7 includes the insulation liner 160 having a variable or non-uniform thickness according to a location, and the second insulation liner 164 included in the insulation liner 160 may include the protecting portion 164P having a variable or non-uniform thickness according to a location and having the largest thickness in the first local region 160A of the insulation liner 160. The protecting portion 164P of the second insulation liner 164 may protect the upper corner of the first gate structure GSTA during a process of manufacturing the integrated circuit device 400, thereby reducing or preventing unwanted short circuits or parasitic capacitance between the gate line GL included in the first gate structure GSTA and the source/drain contact CA. Therefore, in the integrated circuit device 200, an insulation distance between the gate line GL and a contact structure adjacent thereto, e.g., the source/ drain contact CA, may be stably secured, and electrical properties and reliability of the integrated circuit device 400 may be improved.

In FIG. 7, a case in which the integrated circuit device 400 includes the gate structures GST and the source/drain contacts CA shown in FIGS. 2A and 2C has been described as an example, but the inventive concept is not limited thereto. In example embodiments, the integrated circuit device 400 may include the gate structures GST2 described with reference to FIG. 3 instead of the gate structures GST. In other example embodiments, the integrated circuit device 400 may include the source/drain contacts CA3 described with reference to FIG. 4 instead of the source/drain contacts CA.

Figure 8:
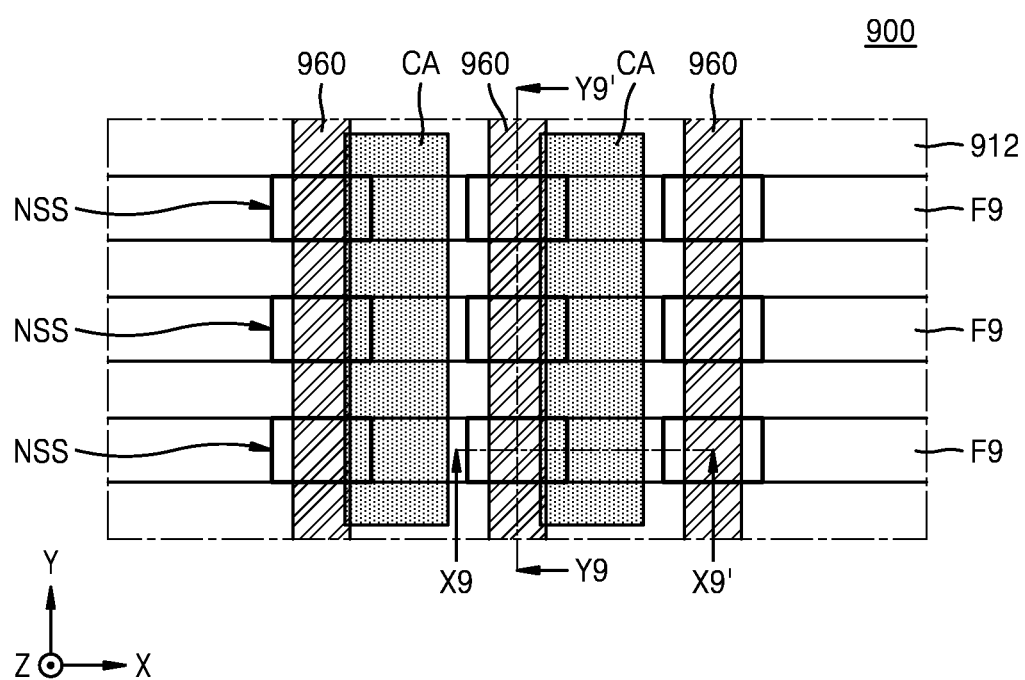
FIG. 8 is a schematic plan layout diagram of some components of an integrated circuit device according to some other embodiments of the inventive concept.
Figure 9:
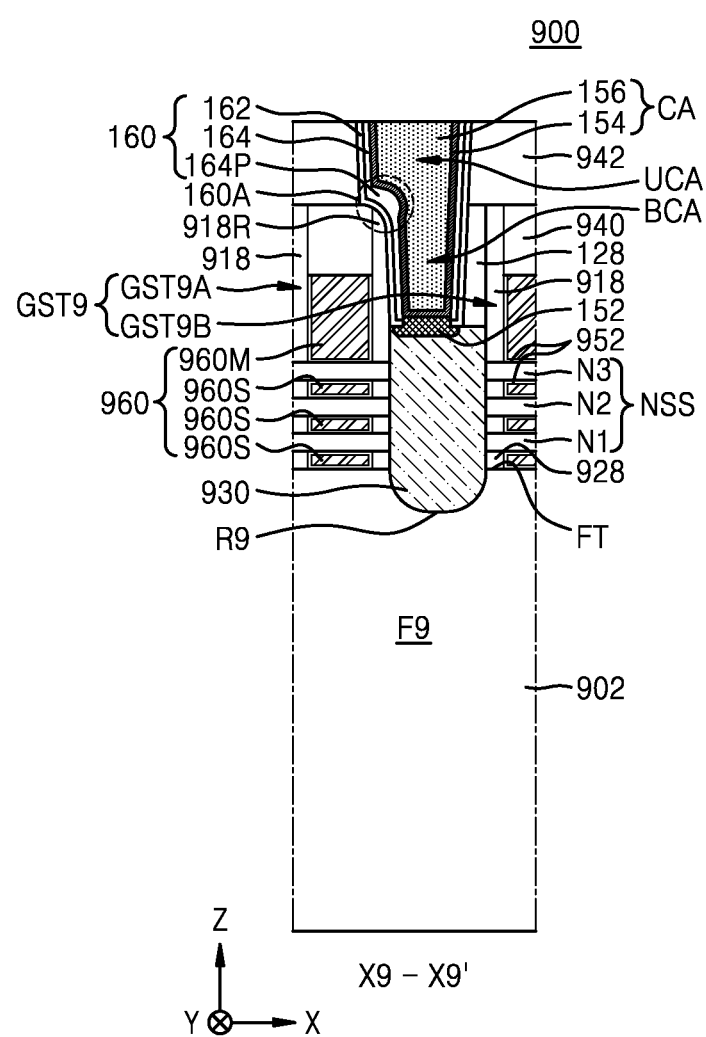
FIG. 9 is a cross-sectional view taken along a line X9-X9' of FIG. 8.
Figure 10:
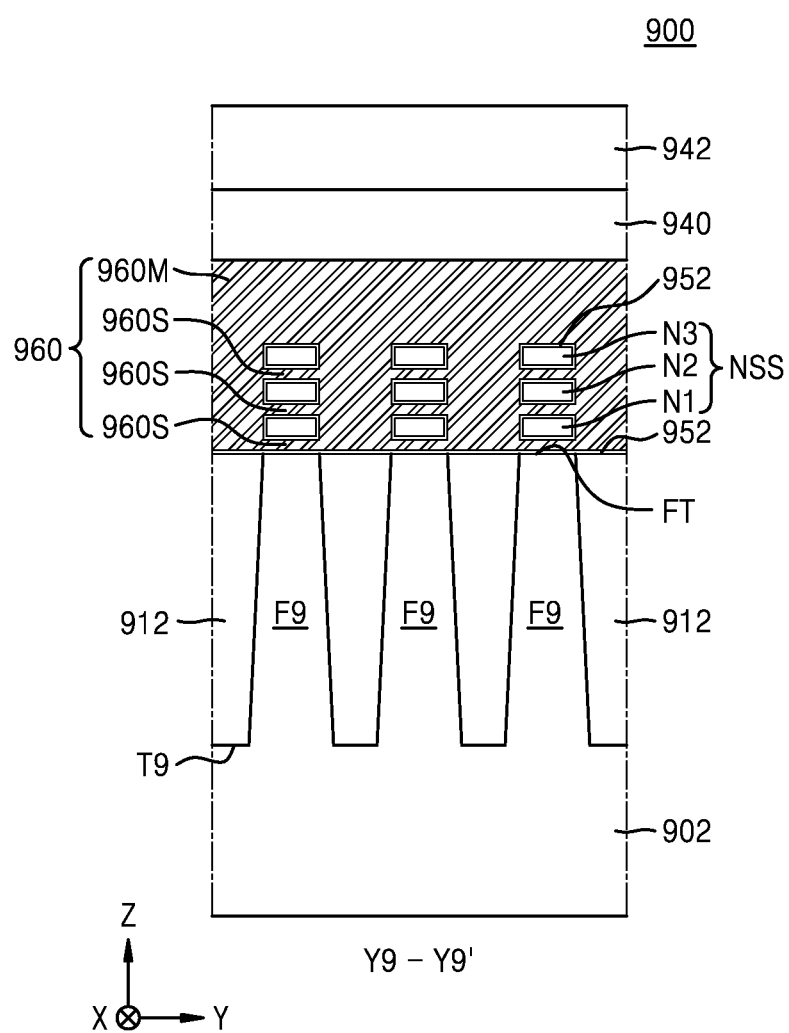
FIG. 10 is a cross-sectional view taken along a line Y9-Y9' of FIG. 8.

FIG. 8 is a schematic plan layout diagram of some components of an integrated circuit device 900 according to some other embodiments of the inventive concept, FIG. 9 is a cross-sectional view taken along a line X9-X9' of FIG. 8, and FIG. 10 is a cross-sectional view taken along a line Y9-Y9' of FIG. 8.

Referring to FIGS. 8 to 10, the integrated circuit device 900 includes a plurality of fin-type active regions F9 protruding from a substrate 902 and extending long in or along the first horizontal direction (X direction) a plurality of nanosheet stacks NSS on or facing fin top surfaces FT of the fin-type active regions F9 at locations spaced upward from the fin-type active regions F9 in the vertical direction (Z direction). The term "nanosheet" as used herein refers to a conductive structure having a cross-section substantially perpendicular to a direction in which an electric current flows. It should be understood that the nanosheet includes nanowires.

As shown in FIG. 10, a trench T9 defining the fin-type active regions F9 may be formed in the substrate 902, and the trench T9 may be filled with a device isolation layer 912.

The substrate 902, the fin-type active regions F9, and the device isolation layer 912 may have substantially the same configurations as those described above for the substrate 110, the fin-type active regions FA, and the device isolation layer 112 shown in FIGS. 2A to 2D.

A plurality of gate lines 960 extend in the second horizontal direction (Y direction) on the fin-type active regions F9. The nanosheet stacks NSS are arranged on the fin top surfaces FT of the fin-type active regions F9 in regions where the fin-type active regions F9 and the gate lines 960 intersect each other and may face the fin top surfaces FT of the fin-type active regions F9 at locations spaced apart from the fin-type active regions F9 in the vertical direction. A plurality of nanosheet transistors may be formed on the substrate 902 at the intersections between the fin-type active regions F9 and the gate lines 960.

The nanosheet stacks NSS may include a plurality of nanosheets N1, N2, and N3 overlapping one another in the vertical direction (Z direction) on the fin top surfaces FT of the fin-type active regions F9. The nanosheets N1, N2, and N3 may include a first nanosheet N1, a second nanosheet N2, and a third nanosheet N3 having different vertical distances from the fin top surfaces FT of the fin-type active regions F9.

Although FIG. 8 shows a case in which the planar or plan view shape of the nanosheet stack NSS is a substantially rectangular, the inventive concept is not limited thereto. The nanosheet stack NSS may have various planar or plan view shapes according to the planar shapes of the fin-type active regions F9 and the gate lines 960. The present embodiment shows a configuration in which the nanosheet stacks NSS and the gate lines 960 are formed on one fin-type active region F9, and the nanosheet stacks NSS are arranged in a line (i.e., aligned) in the first direction (X direction) on the one fin-type active region F9. However, according to the inventive concept, the number of nanosheet stacks NSS arranged on the one fin-type active region F9 is not particularly limited. For example, one nanosheet stack NSS may be formed on the one fin-type active region F9. Although the present embodiment illustrates a case where one nanosheet stack NSS includes three nanosheets, the inventive concept is not limited thereto. For example, the nanosheet stack NSS may include at least two nanosheets, and the number of nanosheets constituting the nanosheet stack NSS is not particularly limited.

The nanosheets N1, N2, and N3 may each have a channel region. In example embodiments, the nanosheets N1, N2, and N3 may each include a Si layer, a SiGe layer, or a combination thereof.

As shown in FIG. 9, a plurality of recessed regions R9 may be formed on the fin-type active region F9, and a plurality of source/drain regions 930 may be arranged in the recessed regions R9. The source/drain regions 930 may include epitaxially grown semiconductor layers. A more detailed configuration of the source/drain regions 930 is substantially the same as that described above for the source/drain regions SD shown in FIGS. 2A and 2C.

The gate line 960 may surround each of the nanosheets N1, N2, and N3 while covering the nanosheet stack NSS on the fin-type active region F9. The gate lines 960 may each include a main gate portion 960M covering the top surface of the nanosheet stack NSS and extending long in or along the second direction (Y direction) and a plurality of sub-gate portions 960S, which are integrally connected to or integral to the main gate portion 960M and are respectively arranged between the nanosheets N1, N2, and N3 and between the fin-type active region F9 and the first nanosheet N1. The nanosheets N1, N2, and N3 may have a gate-all-around (GAA) structure surrounded by the gate line 960. A material constituting the gate line 960 is substantially the same as that described above for the gate line GL with reference to FIGS. 1 and 2A to 2C. A gate insulation layer 952 may be interposed between the nanosheet stack NSS and the gate line 960. The gate insulation layer 952 may have substantially the same configuration as that described above for the gate insulation layer 132 with reference to FIGS. 2A to 2C.

The source/drain contact CA may be formed over each of the source/drain regions 930, and the metal silicide layer 152 may be formed between the source/drain region 930 and the source/drain contact CA. The detailed configurations of the source/drain contact CA and the metal silicide layer 152 may be similar or identical to those described above with reference to FIGS. 2A and 2C.

Both sidewalls of each of the gate lines 960 may be covered by a plurality of outer insulation spacers 918. The outer insulation spacers 918 may cover both sidewalls of the main gate portion 960M on the nanosheet stacks NSS.

A plurality of inner insulation spacers 928 may be interposed between the nanosheets N1, N2, and N3 and between the fin-type active region F9 and the first nanosheet N1. Both sidewalls of each of the sub-gate portions 960S may be covered by the inner insulation spacers 928 with the gate insulation layer 952 interposed therebetween. The inner insulation spacers 928 may be interposed between the sub-gate portions 960S and the source/drain regions 930. In example embodiments, the outer insulation spacers 918 and the inner insulation spacers 928 may include the same insulation material. In other example embodiments, the outer insulation spacers 918 and the inner insulation spacers 928 may include different insulation materials. The inner insulation spacers 928 may include SiN, SiCN, SiBN, SiON, SiOCN, SiBCN, SiOC, SiO₂, or a combination thereof. The inner insulation spacers 928 may further include an air gap. In example embodiments, when the nanosheet stack NSS and the gate line 960 surrounding the same constitute a PMOS transistor, the inner insulation spacer 928 may be omitted. In this case, the gate insulation layer 952 covering the sub-gate portions 960S may directly contact the source/drain region 930. As used herein, elements, layers, or regions in "direct" contact or "directly on" one another may be free of intervening elements, layers, or regions therebetween.

The top surfaces of the insulation capping lines 940 and the outer insulation spacers 918 may be covered by a top insulation layer 942. The source/drain contact CA and the insulation liner 160 may penetrate through the top insulation layer 942 in the vertical direction (Z direction) and contact the metal silicide layer 152. The insulation capping line 940 and the top insulation layer 942 may have substantially the same configurations as those described above for the insulation capping line 140 and the top insulation layer 142 with reference to FIGS. 2A to 2C.

As shown in FIG. 9, in the integrated circuit device 900, one gate line 960, one insulation capping line 940 covering the top surface of the one gate line 960, and the outer insulation spacer 918 covering sidewalls of the one gate line 960 and the one insulation capping line 940 may constitute one gate structure GST9. A plurality of gate structures GST9 may be arranged on one fin-type active region F9, and the gate structures GST9 may extend parallel to one another in the second horizontal direction (Y direction).

The gate structures GST9 include a pair of gate structures GST9 adjacent to each other, and the pair of gate structures GST9 include a first gate structure GST9A disposed at a location relatively close to the source/drain contact CA interposed between the pair of gate structures GST9 in the first direction (X direction) and a second gate structure GST9B disposed at a location relatively far from the source/drain contact CA. Sidewalls of the source/drain contact CA is surrounded by the insulation liner 160.

A portion of the outer insulation spacer 918 included in the first gate structure GST9A adjacent to the source/drain contact CA may include a top portion 918R having the top surface lower than those of the other portions of the outer insulation spacer 918 relative to the substrate 102. At least a portion of the top surface of the top portion 918R may be at a level lower than those of the topmost surface levels of the other portion of the outer insulation spacer 918 included in the first gate structure GST9A. At least a portion of the top surface of the top portion 918R of the outer insulation spacer 918 included in the first gate structure GST9A may be at a level lower than that of the topmost surface level of the first gate structure GST9A. Therefore, the respective shapes of both or opposing sides of the first gate structure GST9A may be asymmetric in the first direction (X direction).

A first local region 160A of the insulation liner 160 having a relatively large thickness may be in contact with the top portion 918R of the outer insulation spacer 918. The first gate structure GST9A may contact the insulation liner 160 in the first horizontal direction (X direction). The second gate structure GST9B may be spaced apart from the insulation liner 160 in the first horizontal direction (X direction) with the inter-gate insulation layer 128 therebetween.

Similar to the integrated circuit device 100 described above with reference to FIGS. 1 and 2A to 2D, the integrated circuit device 900 shown in FIGS. 8 to 10 includes the insulation liner 160 having a variable or non-uniform thickness according to a location, and the second insulation liner 164 included in the insulation liner 160 may include the protecting portion 164P having a variable or non-uniform thickness according to a location and having the largest thickness in the first local region 160A of the insulation liner 160. The protecting portion 164P of the second insulation liner 164 may protect the upper corner of the first gate structure GST9A during a process of manufacturing the integrated circuit device 400, thereby reducing or preventing unwanted short circuits or parasitic capacitance between the gate line GL included in the first gate structure GST9A and the source/drain contact CA. Therefore, in the integrated circuit device 900, an insulation distance between the gate line 960 and a contact structure adjacent thereto, e.g., the source/drain contact CA, may be stably secured, and electrical properties and reliability of the integrated circuit device 900 may be improved.

In FIG. 9, a case where the integrated circuit device 900 includes the source/drain contact CA shown in FIGS. 2A and 2C has been described as an example, but the inventive concept is not limited thereto. In example embodiments, the integrated circuit device 900 may include the source/drain contacts CA3 described with reference to FIG. 4 instead of the source/drain contacts CA.

Hereinafter, a method of manufacturing an integrated circuit device according to embodiments of the inventive concept will be described in detail.

FIGS. 11A to 11L are cross-sectional views of a method of manufacturing an integrated circuit device according to embodiments of the inventive concept, according to a process sequence. FIGS. 11A to 11L show cross-sectional configurations according to a process sequence of partial regions of portions corresponding to cross-sections along the line X2-X2' of FIG. 1. An example method of manufacturing the integrated circuit device 100 shown in FIGS. 1 and 2A to 2D will be described with reference to FIGS. 11A to 11L. Although FIGS. 11A to 11L show a process sequence in a partial region of the second device region RX2, the same or similar processes as may be performed for the first device region RX1. In FIGS. 11A to 11L, the same reference numerals as those in FIGS. 1 and 2A to 2D denote the same elements or members, and descriptions identical to those given above will be omitted below.

Figure 11A:
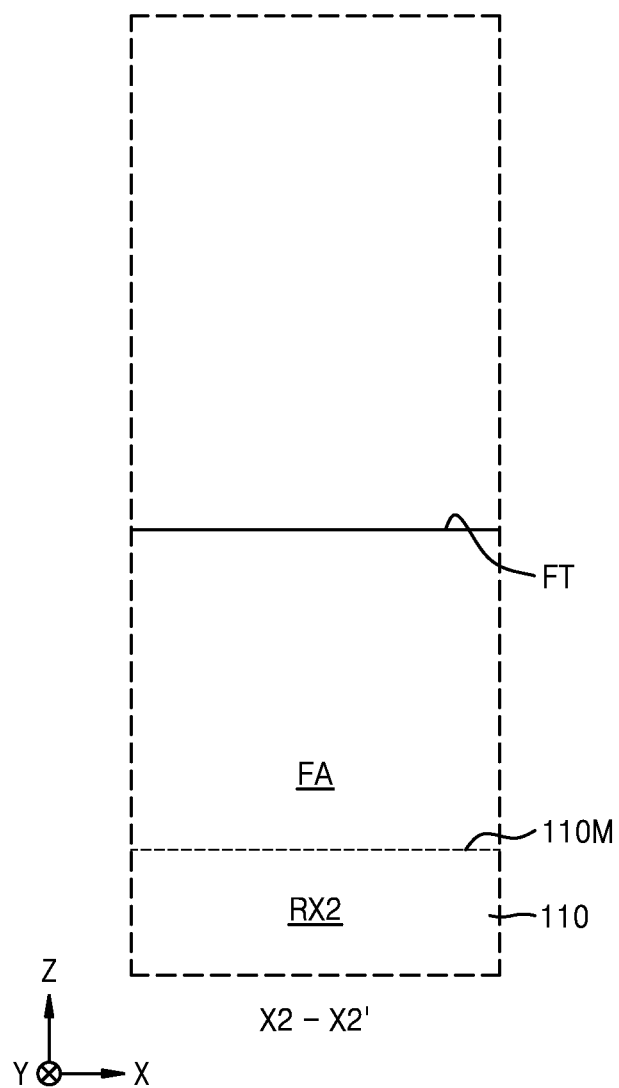
FIGS. 11A, 11B, 11C, 11D, 11E, 11F, 11G, 11H, 11I, 11J, 11K, and 11L are cross-sectional views illustrating a method of manufacturing an integrated circuit device according to embodiments of the inventive concept, according to a process sequence.

Referring to FIG. 11A, the fin-type active regions FA protruding upward from a main surface 110M of the substrate 110 in the vertical direction (Z direction) and extending parallel to one another in the first direction (X direction) may be formed by etching portions of the substrate 110 in the first device region RX1 and the second device region RX2, and the device isolation layer 112 (refer to FIG. 2B) covering both sidewalls of a lower portion of each of the fin-type active regions FA may be formed. Next, a deep trench DT (refer to FIG. 2B) defining the first device region RX1 and the second device region RX2 may be formed by etching a portion of the device isolation layer 112 and a portion of the substrate 110, and the deep trench DT may be filled with the inter-device isolating insulation layer 114. Therefore, as shown in FIG. 2B, the deep trench DT is filled with the inter-device isolating insulation layer 114 in the inter-device isolation region DTA, and a structure in which the fin-type active regions FA protrude above the top surface of the device isolation layer 112 in the first device region RX1 and the second device region RX2 may be obtained.

Figure 11B:
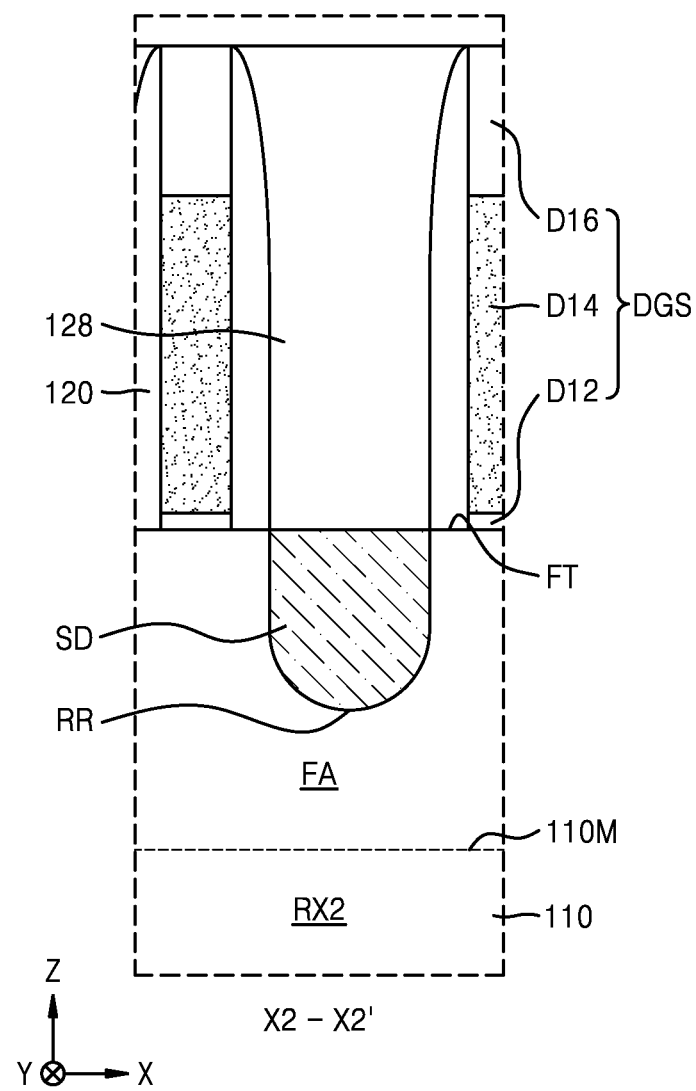

Referring to FIG. 11B, a plurality of dummy gate structures DGS extending across the fin-type active regions FA on the device isolation layer 112 and the inter-device isolating insulation layer 114 (refer to FIG. 2B) may be formed. The dummy gate structures DGS may each include a dummy gate insulation layer D12, a dummy gate line D14, and a dummy insulation capping layer D16 that are sequentially stacked on the fin-type active regions FA, the device isolation layer 112, and the inter-device isolating insulation layer 114 (refer to FIG. 2B). The dummy gate insulation layer D12 may include a silicon oxide film. The dummy gate line D14 may include a polysilicon film. The dummy insulation capping layer D16 may include a silicon nitride film.

The insulation spacers 120 may be formed on both sidewalls of the dummy gate structures DGS, and the recessed regions RR may be formed in the fin-type active regions FA by etching portions of the fin-type active regions FA exposed between the dummy gate structures DGS.

Next, the source/drain regions SD filling the recessed regions RR may be formed in the first device region RX1 and the second device region RX2. Although FIG. 11B shows a case where the level of the top surfaces of the source/drain regions SD is the same as the level of the fin top surfaces FT of the fin-type active regions FA, but the inventive concept is not limited thereto. For example, the level of the top surfaces of the source/drain regions SD may be lower or higher than the level of the fin top surfaces FT.

In example embodiments, the source/drain region SD formed in the first device region RX1 may include a Si layer doped with an n-type dopant, and the source/drain region SD formed in the second device region RX2 may include a SiGe layer doped with a p-type dopant.

To form the source/drain regions SD, a low-pressure chemical vapor deposition (LPCVD) process, a selective epitaxial growth (SEG) process, or a cyclic deposition and etching (CDE) process may be performed using raw materials including elemental semiconductor precursors. In example embodiments, to form the source/drain region SD including a Si layer doped with an n-type dopant, silane ($SiH_4$), disilane ($Si_2H_6$), trisilane ($Si_3H_8$), dichloro silane ($SiH_2Cl_2$), etc. may be used as a Si source. The n-type dopant may be selected from among phosphorus(P), arsenic As), and antimony (Sb). In other example embodiments, a Si source and a Ge source may be used to form the source/drain region SD including a SiGe layer doped with a p-type dopant. As the Si source, silane ($SiH_4$), disilane ($Si_2H_6$), trisilane ($Si_3H_8$), dichloro silane ($SiH_2Cl_2$), etc. may be used. As the Ge source, Germain ($GeH_4$), Degermain ($Ge_2H_6$), Trigermain ($Ge_3H_8$), tetragermain ($Ge_4H_{10}$), dichlorogermain ($Ge_2H_2Cl_2$), etc. may be used. The p-type dopant may be selected from between boron (B) and gallium (Ga).

The process of forming the source/drain region SD in the first device region RX1 and the process of forming the source/drain region SD in the second device region RX2 may be sequentially performed. For example, after forming the source/drain region SD in the first device region RX1, the source/drain region SD may be formed in the second device region RX2. Alternatively, after forming the source/drain region SD in the second device region RX2, the source/drain region SD may be formed in the first device region RX1.

After the source/drain regions SD are formed in the first device region RX1 and the second device region RX2, inter-gate insulation layer 128 covering the source/drain regions SD between the dummy gate structures DGS may be formed. The inter-gate insulation layer 128 may be formed to cover the device isolation layer 112 and the inter-device isolating insulation layer 114 shown in FIG. 2B. The inter-gate insulation layer 128 may be formed to have a planarized top surface. After the inter-gate insulation layer 128 is formed, the top surface of the dummy insulation capping layer D16 may be exposed.

Figure 11C:
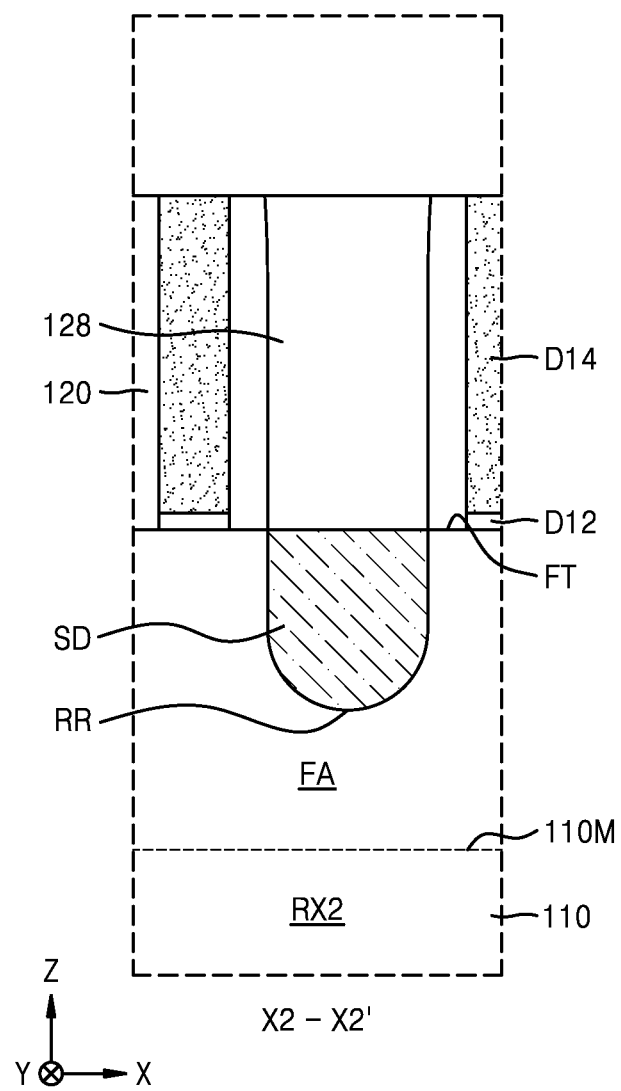

Referring to FIG. 11C, the top surface of the dummy gate line D14 may be exposed by removing the dummy insulation capping layer D16 and insulation layers around the dummy insulation capping layer D16 in the structure resulting from FIG. 11B through a chemical mechanical polishing (CMP) process. As a result, the heights of the inter-gate insulation layer 128 and the insulation spacers 120 may be lowered.

Figure 11D:
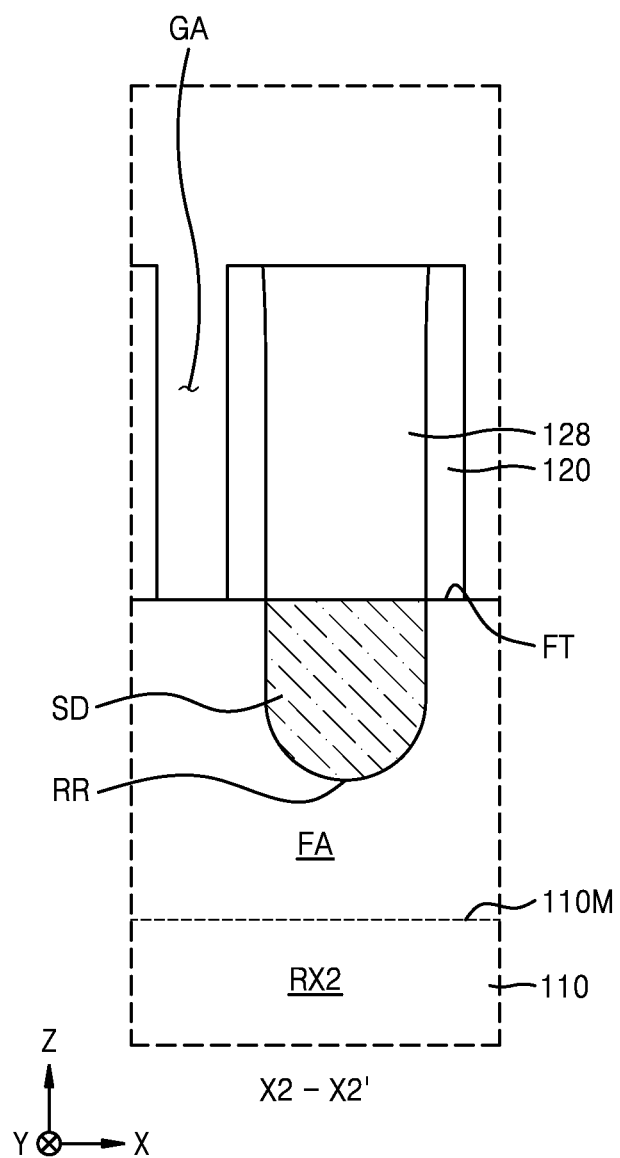

Referring to FIG. 11D, a plurality of gate spaces GA may be formed by removing a plurality of dummy gate lines D14 and a plurality of dummy gate insulation layers D12 from a result structure of FIG. 11C. The insulation spacers 120, the fin-type active regions FA, the device isolation layer 112, and the inter-device isolating insulation layer 114 (refer to FIG. 2B) may be exposed through the gate spaces GA.

Figure 11E:
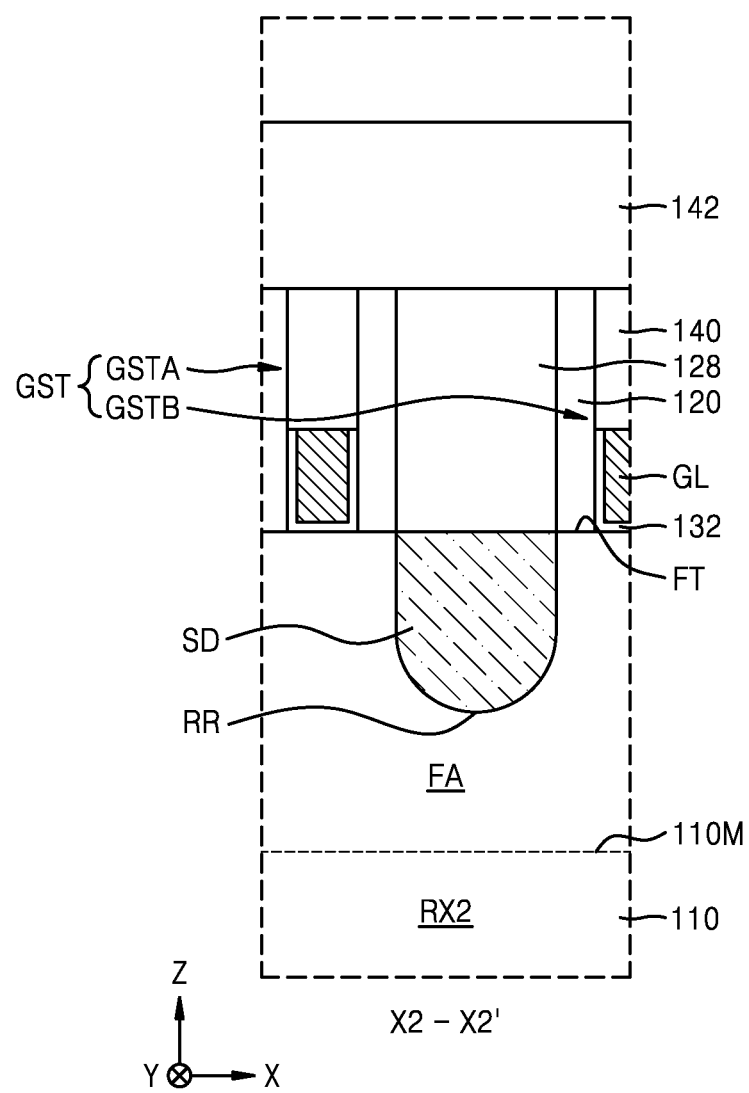

Referring to FIG. 11E, in the structure resulting from FIG. 11D, the gate insulation layers 132, the gate lines GL, and the insulation capping lines 140 may be formed in the gate spaces GA.

To form the gate insulation layer 132, the gate lines GL, and the insulation capping lines 140, the gate insulation layers 132 and the gate lines GL filling the gate spaces GA may be formed first, and then the gate insulation layers 132 and the gate lines GL may be etched back, such that the gate insulation layers 132 and the gate lines GL fill only lower portions of the gate spaces GA. While the gate insulation layers 132 and the gate lines GL are being etched back, upper portions of the insulation spacers 120 and the inter-gate insulation layer 128 are also removed, and thus the heights of the insulation spacers 120 and the inter-gate insulation layer 128 may be lowered. Next, the insulation capping lines 140 covering the top surfaces of the gate lines GL and the gate insulation layers 132 in the gate spaces GA and filling upper portions of the gate spaces GA may be formed. The insulation capping lines 140 may be formed to have planarized top surfaces. While the top surfaces of the insulation capping lines 140 are being planarized, upper portions of the insulation spacers 120 and the inter-gate insulation layer 128 are also removed, and thus the heights of the insulation spacers 120 and the inter-gate insulation layer 128 may be further lowered.

Next, the top insulation layer 142 covering the top surfaces of the insulation capping lines 140 and the inter-gate insulation layer 128 may be formed.

In the structure resulting from FIG. 11E, one gate line GL, one insulation capping line 140 covering the top surface of the one gate line GL, and the insulation spacer 120 covering the sidewalls of the one gate line GL and the one insulation capping line 140 may constitute one gate structure GST.

In example embodiments, before forming the gate insulation layer 132, an interfacial layer (not shown) covering surfaces of the fin-type active regions FA exposed through the gate spaces GA may be formed. To form the interfacial layer, portions of the fin-type active regions FA exposed in the gate spaces GA may be oxidized.

Figure 11F:
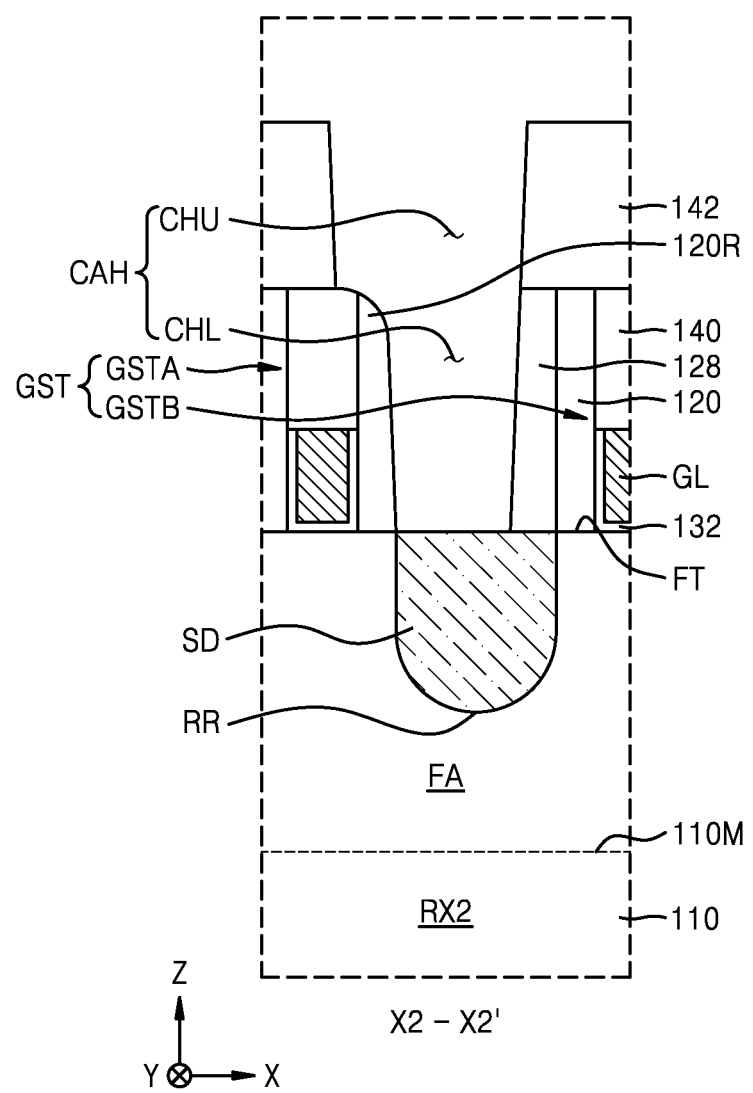

Referring to FIG. 11F, the source/drain contact holes CAH penetrating through the top insulation layer 142 and the inter-gate insulation layer 128 and exposing the top surfaces of the source/drain regions SD may be formed by etching portions of the top insulation layer 142 and the inter-gate insulation layer 128 in the structure resulting from FIG. 11E. The source/drain contact hole CAH may be formed to include a lower contact hole portion CHL interposed between a pair of gate structures GST arranged adjacent to each other and an upper contact hole portion CHU, which penetrates through the top insulation layer 142 in the vertical direction (Z direction) and is connected to the lower contact hole portion CHL.

The upper contact hole portion CHU of the source/drain contact hole CAH may be formed to overlap a portion of the first gate structure GSTA, which is one of the pair of gate structures GST, in the vertical direction (Z direction). The upper contact hole portion CHU of the source/drain contact hole CAH may be formed to not to overlap the second gate structure GSTB, which is the other one of the pair of gate structures GST, in the vertical direction (Z direction).

The source/drain contact holes CAH may be formed to be self-aligned by the insulation spacers 120 and the insulation capping lines 140. To form the source/drain contact hole CAH, first, the top insulation layer 142 may be etched to form the upper contact hole portion CHU. After the upper contact hole portion CHU is formed, the top surface of an upper corner of the first gate structure GSTA may be exposed through the upper contact hole portion CHU. In this state, the inter-gate insulation layer 128 may be etched through the upper contact hole portion CHU, thereby forming the lower contact hole portion CHL that is self-aligned by the insulation spacer 120 and the insulation capping line 140. While the lower contact hole portion CHL is being formed, a portion of the upper corner of the first gate structure GSTA may be consumed by the etching atmosphere of the inter-gate insulation layer 128. As a result, the level of at least a portion of the top portion 120R of the portion of the insulation spacer 120 included in the first gate structure GSTA exposed from the source/drain contact hole CAH may become lower than that of the topmost surface level of the first gate structure GSTA and may become lower than that of the topmost surface level of the insulation spacer 120 included in the second gate structure GSTB.

After the source/drain contact hole CAH exposing the source/drain regions SD is formed, both or opposing sides of the source/drain contact hole CAH in the first horizontal direction (X direction) may have an asymmetric structure.

Figure 11G:
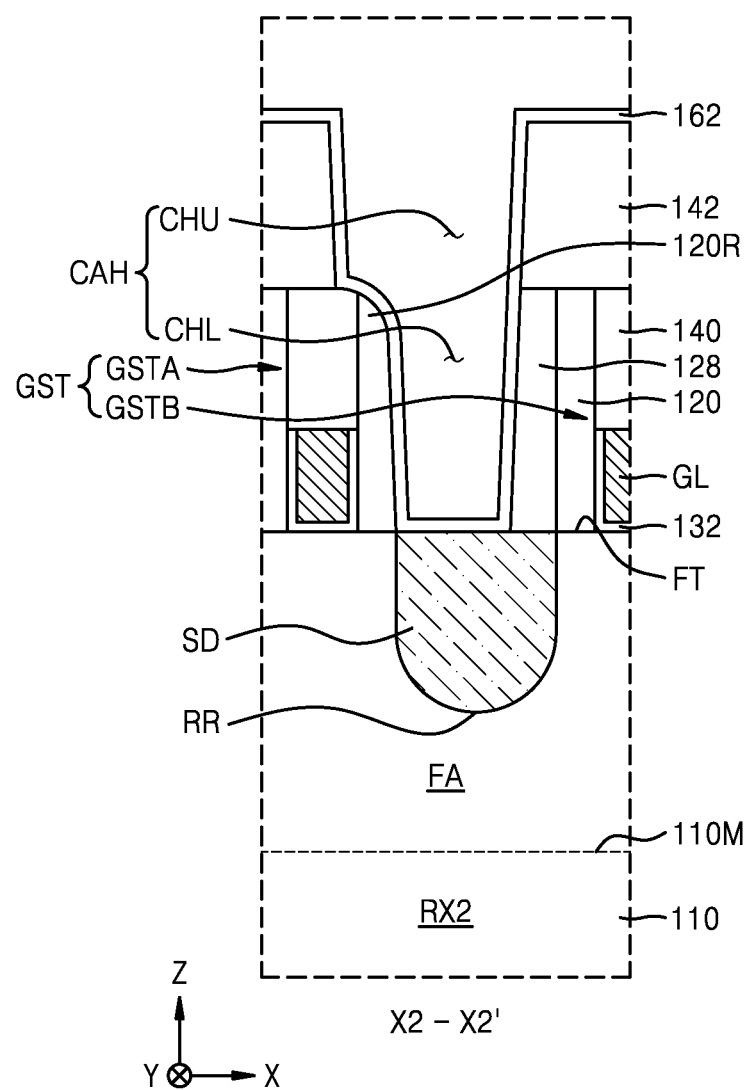

Referring to FIG. 11G, in the structure resulting from FIG. 11F, the first insulation liner 162 may be formed to conformally cover the inner wall of the source/drain contact hole CAH.

An ALD process may be performed to form the first insulation liner 162. In example embodiments, the first insulation liner 162 may be formed to cover the inner wall of the source/drain contact hole CAH with a constant or substantially uniform thickness. The first insulation liner 162 may be formed to contact the top portion 120R of the insulation spacer 120 at the upper corner of the first gate structure GSTA.

Figure 11H:
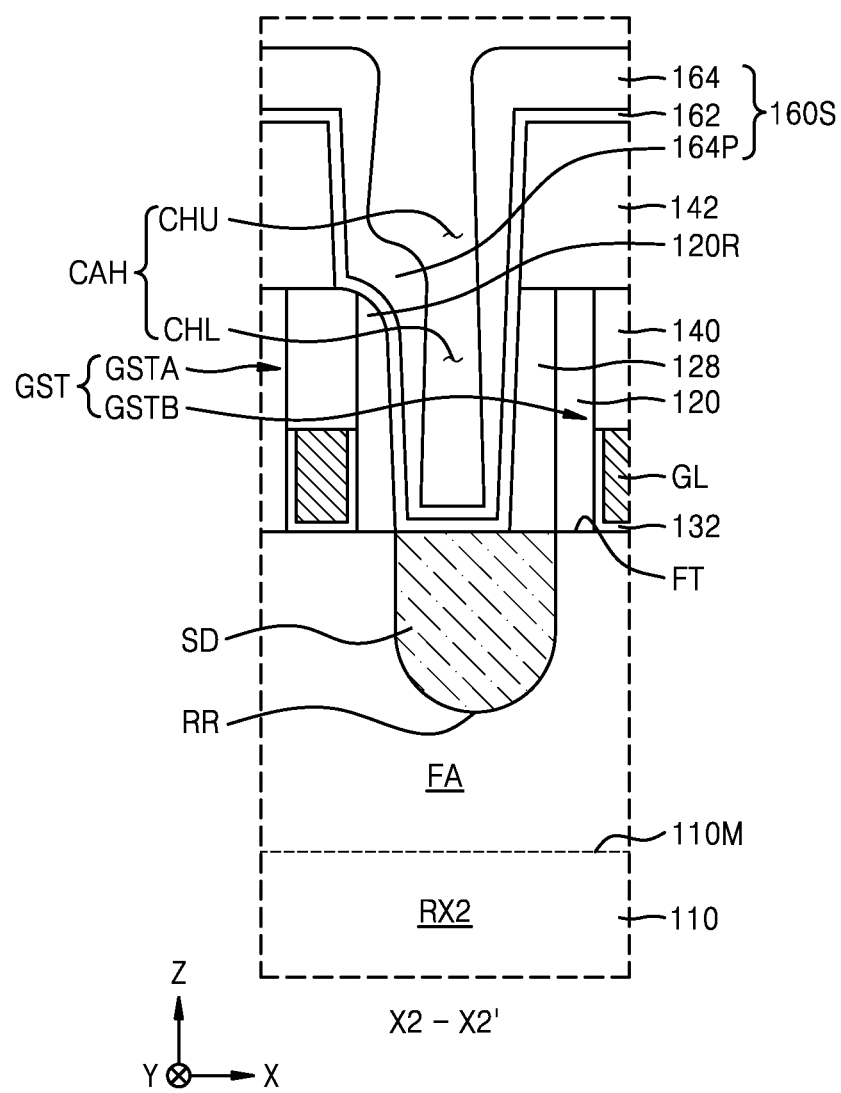

Referring to FIG. 11H, the second insulation liner 164 covering the first insulation liner 162 may be formed in the structure resulting from FIG. 11G.

When forming the second insulation liner 164, the second insulation liner 164 may not be conformally formed on the first insulation liner 162 and may be formed to have a variable or non-uniform thickness depending on a location.

In exemplary embodiments, a PECVD process or a PVD process may be performed to form the second insulation liner 164. At this time, a deposition atmosphere for forming the second insulation liner 164, e.g., a temperature, a pressure, a plasma formation condition, etc. are controlled or fluxes of source gases are controlled in consideration of sticking coefficients of atoms constituting the second insulation liner 164, such that thicknesses of portions of the second insulation liner 164 covering the first insulation liner 162 on the top surface of the top portion 120R of the insulation spacer 120 and the top surface of the top insulation layer 142 become greater than a thickness of a portion of the second insulation liner 164 covering the first insulation liner 162 on the bottom and along sidewalls of the source/drain contact hole CAH. In example embodiments, the second insulation liner 164 may be formed to cover the first insulation liner 162 with a greater thickness as a distance from the substrate 110 increases.

Figure 11I:
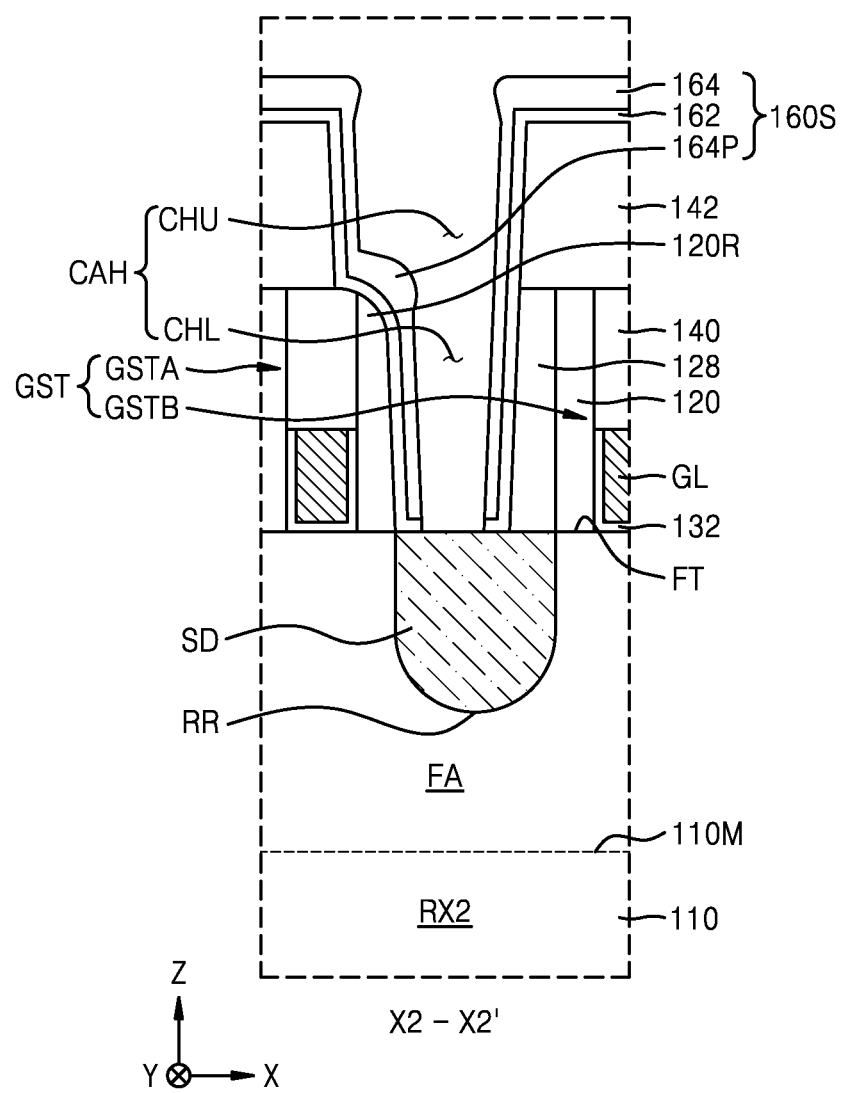

Referring to FIG. 11I, the second insulation liner 164 and the first insulation liner 162 may be anisotropically etched in the structure resulting from FIG. 11H to expose the source/drain region SD at the bottom of the source/drain contact hole CAH and form an insulation liner structure 160S including remaining portions of the first insulation liner 162 and the second insulation liner 164 after the etching.

A portion of the source/drain region SD exposed at the bottom of the source/drain contact hole CAH may be a portion of the top surface of the source/drain region SD closer to the first gate structure GSTA than the second gate structure GSTB.

After the source/drain region SD is exposed at the bottom of the source/drain contact hole CAH by etching the second insulation liner 164 and the first insulation liner 162, a portion of the second insulation liner 164 covering the top portion 120R of the insulation spacer 120 may remain as the protecting portion 164P having a thickness greater than the other portions of the second insulation liner 164 covering the inner wall of the source/drain contact hole CAH.

After the source/drain region SD is exposed at the bottom of the source/drain contact hole CAH by etching the second insulation liner 164 and the first insulation liner 162, the top surface of the top insulation layer 142 may be covered by portions of the first insulation liner 162 and the second insulation liner 164 remaining after the etching.

Figure 11J:
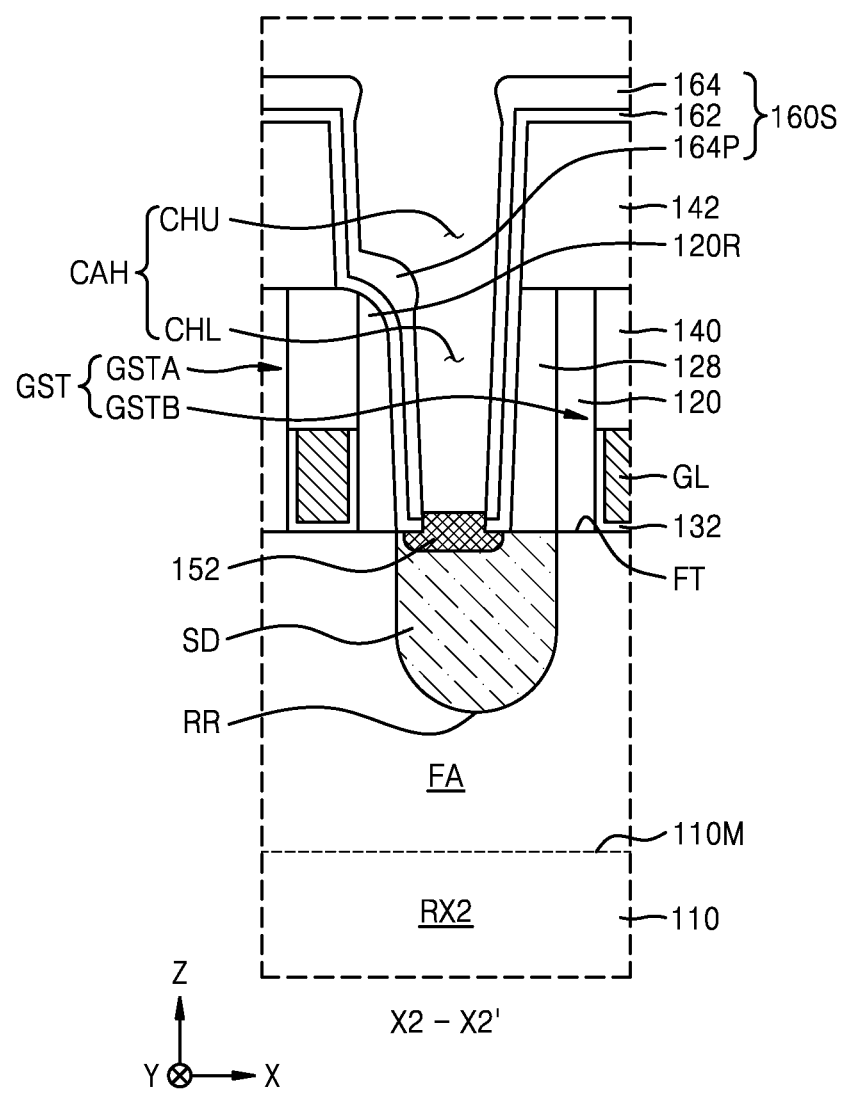

Referring to FIG. 11J, the metal silicide layer 152 may be formed on the source/drain region SD exposed through the source/drain contact hole CAH in the structure resulting from FIG. 11I.

In example embodiments, to form the metal silicide layer 152, a process for forming a metal liner (not shown) conformally covering the inner wall of the source/drain contact hole CAH and inducing a reaction between the source/drain region SD and a metal constituting the metal liner by heat-treating the metal liner may be included. After the metal silicide layer 152 is formed, remaining portions of the metal liner may be removed. While the metal silicide layer 152 is being formed, a portion of the source/drain region SD may be converted into the metal silicide layer 152.

After the metal silicide layer 152 is formed, a portion of the metal silicide layer 152 may be located at a level lower than the level of the fin top surface FT of the fin-type active region FA, and the other portion of the metal silicide layer 152 may be located at a level higher than the level of the fin top surface FT of the fin-type active region FA. In example embodiments, the metal liner may include titanium (Ti), and the metal silicide layer 152 may include a titanium silicide layer, but the inventive concept is not limited thereto.

Figure 11K:
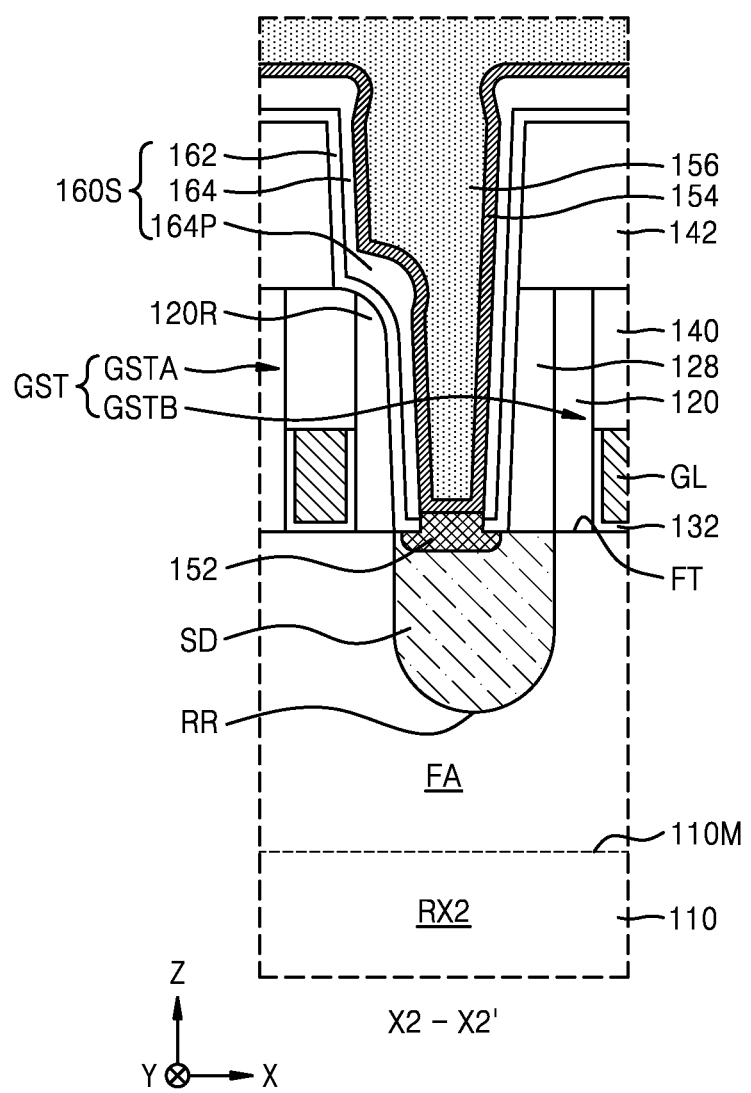

Referring to FIG. 11K, the conductive barrier layer 154 conformally covering the top surface of the metal silicide layer 152 and the front surface of the second insulation liner 164 in the source/drain contact hole CAH and the metal plug 156 filling the source/drain contact hole CAH on the conductive barrier layer 154 may be formed in the structure resulting from FIG. 11J. The conductive barrier layer 154 and the metal plug 156 may each be formed through a CVD process, a PVD process, or an electroplating process.

Figure 11L:
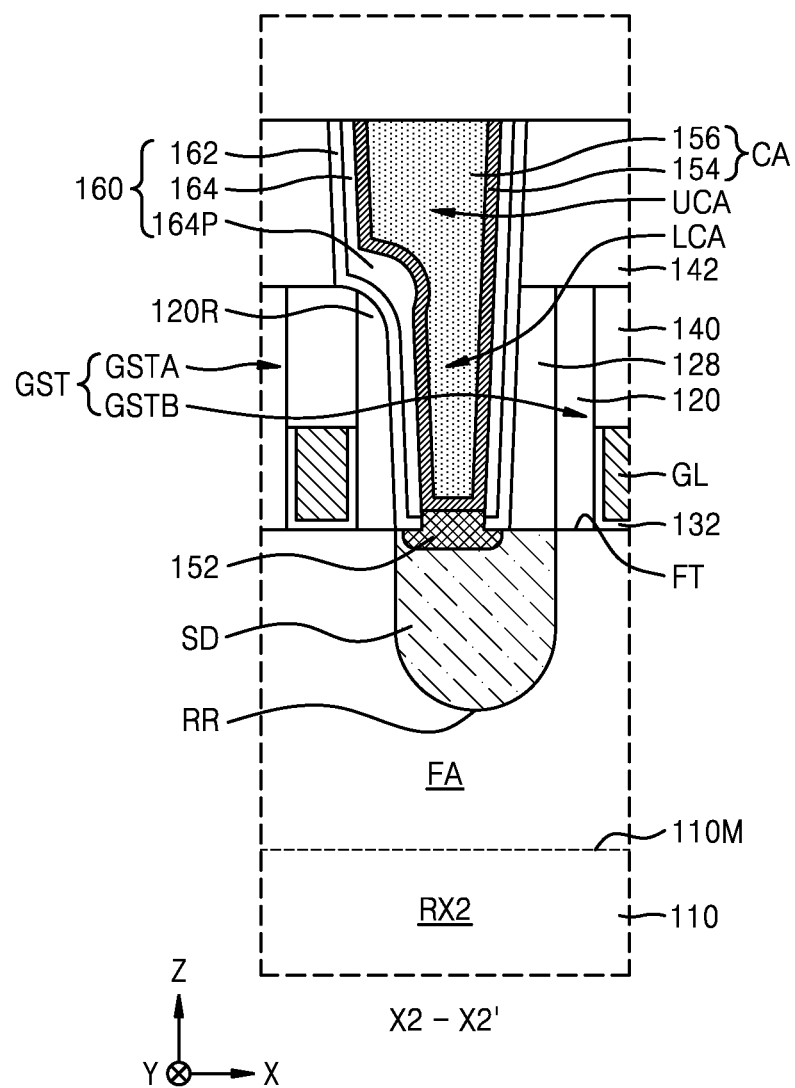

Referring to FIG. 11L, upper portions of the conductive barrier layer 154, the metal plug 156, the first insulation liner 162, and the second insulation liner 164 are partially removed to expose the top surface of the insulation liner 160 and the top surface of the top insulation layer 142, thereby forming the insulation liner 160 and the source/drain contact CA. The source/drain contacts CA may include the lower contact portion LCA and the upper contact portion UCA, which overlap each other in the vertical direction (Z direction) and are integrally connected to or integral to each other.

Next, as shown in FIGS. 2A and 2B, the etch stop layer 182 and the interlayer insulation layer 184 may be sequentially formed on a result structure of FIG. 11L to form the insulation structure 180, and a plurality of source/drain via contacts CAV and the gate contacts CB connected to the gate lines GL may be formed, thereby manufacturing the integrated circuit device 100 described above with reference to FIGS. 1 and 2A to 2D.

In example embodiments, the source/drain via contacts CAV and the gate contacts CB may be formed at the same time. In other example embodiments, the source/drain via contacts CAV and the gate contacts CB may be sequentially formed through separate processes. In this case, the source/drain via contacts CAV may be formed first, and then the gate contacts CB may be formed. Alternatively, the gate contacts CB may be formed first, and then the source/drain via contacts CAV may be formed.

The source/drain via contacts CAV may be formed to penetrate through the interlayer insulation layer 184 and the etch stop layer 182 and contact the top surface of the source/drain contact CA. The gate contacts CB may be formed to penetrate through the interlayer insulation layer 184, the etch stop layer 182, the top insulation layer 142, and the insulation capping line 140 and contact the top surface of the gate line GL.

An example method of manufacturing the integrated circuit device 100 shown in FIGS. 1 and 2A to 2D has been described above with reference to FIGS. 11A to 11L. However, it will be understood that integrated circuit devices 200, 300, 400, and 900 shown in FIGS. 3 to 10 and various integrated circuit devices having similar structures may be manufactured by making various modifications to the descriptions given with reference to FIGS. 11A to 11L within the technical spirit of the inventive concept.

In example embodiments, to manufacture the integrated circuit device 200 shown in FIG. 3, processes as described above with reference to FIGS. 11A to 11L may be performed. However, in the process described above with reference to FIG. 11F, while the lower contact hole portion CHL self-aligned by the insulation spacer 120 and the insulation capping line 140 is being formed by etching the inter-gate insulation layer 128 through the upper contact hole portion CHU, an etching atmosphere for the inter-gate insulation layer 128 may be controlled to increase an amount of the upper corner of the first gate structure GSTA consumed by the etching atmosphere, thereby forming the first gate structure GST2A including the insulation spacer 120 having the top portion 220R shown in FIG. 3. Thereafter, the integrated circuit device 200 shown in FIG. 3 may be manufactured by performing the processes described above with reference to FIGS. 11G to 11L.

In other example embodiments, to manufacture the integrated circuit device 300 shown in FIG. 4, processes as described above with reference to FIGS. 11A to 11L may be performed. However, in the process described above with reference to FIG. 11F, the width of the source/drain contact hole CAH in the first direction (X direction) may be increased, such that the insulation spacer 120 included in the first gate structure GSTA and the insulation spacer 120 included in the second gate structure GSTB are exposed through the source/drain contact hole CAH. Thereafter, the integrated circuit device 300 shown in FIG. 4 may be manufactured by performing the processes described above with reference to FIGS. 11G to 11L.

While the inventive concept has been particularly shown and described with reference to embodiments thereof, it will be understood that various changes in form and details may be made therein without departing from the spirit and scope of the following claims.

What is claimed is:
1. An integrated circuit device comprising:
 a fin-type active region extending along a first horizontal direction on a substrate;
 a plurality of gate structures each comprising a gate line extending along a second horizontal direction crossing the first horizontal direction on the fin-type active region and insulation spacers on sidewalls of the gate line;
 a source/drain contact between a first gate structure and a second gate structure, which are among the gate structures and are adjacent to each other, and having opposing sides that are asymmetric in the first horizontal direction; and
 an insulation liner on sidewalls of the source/drain contact,
 wherein the source/drain contact comprises a lower contact portion facing the first gate structure and the second gate structure in the first horizontal direction and an upper contact portion that is integral to the lower contact portion, the upper contact portion comprises a horizontal extension, which extends on an upper corner of the first gate structure adjacent to the source/drain contact and overlaps at least a portion of the first gate structure in a vertical direction,
 wherein the insulation liner comprises a first local region that electrically separates the upper corner of the first gate structure and the horizontal extension of the source/drain contact, and a second local region that is farther from the substrate than the first local region, and
 wherein a thickness of the first local region is greater than that of the second local region.

2. The integrated circuit device of claim 1, wherein the first gate structure comprises a first gate line and a first insulation spacer between the first gate line and the source/drain contact, the first insulation spacer having a top portion defining a portion of the upper corner of the first gate structure,
 the second gate structure comprises a second gate line and a second insulation spacer between the second gate line and the source/drain contact, and
 at least a portion of the top portion of the first insulation spacer is closer to the substrate than a topmost surface of the second insulation spacer, and the first local region of the insulation liner is between the top portion and the source/drain contact.

3. The integrated circuit device of claim 1, wherein, in the first horizontal direction, a width of the upper contact portion of the source/drain contact is greater than a width of the lower contact portion.

4. The integrated circuit device of claim 1, wherein, in the first horizontal direction, a distance between the source/ drain contact and the first gate structure is less than a distance between the source/drain contact and the second gate structure.

5. The integrated circuit device of claim 1, wherein the insulation liner further comprises a third local region that is closer to the substrate than the first local region, and the thickness of the first local region is greater than that of the third local region.

6. The integrated circuit device of claim 1, wherein the insulation liner comprises a first insulation liner including a portion in contact with the upper corner of the first gate structure and a second insulation liner stacked on the first insulation liner and including a portion in contact with the horizontal extension of the source/drain contact,
   the first insulation liner has a same thickness in the first local region and the second local region, and
   a thickness of the second insulation liner in the first local region is greater than a thickness of the second insulation liner in the second local region.

7. The integrated circuit device of claim 1, further comprising an inter-gate insulation layer between the second gate structure and the insulation liner,
   wherein the first gate structure is in contact with the insulation liner in the first horizontal direction, and
   the second gate structure is spaced apart from the insulation liner in the first horizontal direction with the inter-gate insulation layer therebetween.

8. The integrated circuit device of claim 1, wherein the source/drain contact is in a source/drain contact hole, and wherein the insulation liner comprises:
   a first insulation liner on an inner wall of the source/drain contact hole between the first gate structure and the second gate structure; and
   a second insulation liner between the first insulation liner and the source/drain contact and in contact with the source/drain contact,
   the first insulation liner has a uniform thickness within the source/drain contact hole, and
   the second insulation liner has a non-uniform thickness within the source/drain contact hole that is largest in the first local region.

9. The integrated circuit device of claim 6, wherein the first insulation liner comprises a first silicon nitride film, and the second insulation liner comprises a second silicon nitride film having a different density than the first silicon nitride film.

10. The integrated circuit device of claim 1, further comprising:
    a source/drain region on the fin-type active region between the first gate structure and the second gate structure; and
    a metal silicide layer between the source/drain region and the source/drain contact, the metal silicide layer having a bottom surface in contact with the source/drain region and a top surface in contact with the source/drain contact,
    wherein, in the first horizontal direction, a distance from the metal silicide layer to the first gate structure is less than a distance from the metal silicide layer to the second gate structure.

11. An integrated circuit device comprising:
    a fin-type active region extending along a first horizontal direction on a substrate;
    a plurality of gate structures extending along a second horizontal direction crossing the first horizontal direction on the fin-type active regions;
    a source/drain region on the fin-type active region between a pair of gate structures among the gate structures, wherein the pair of gate structures are adjacent to each other;
    a source/drain contact that extends along a vertical direction on the source/drain region and has opposing sides in the first horizontal direction that are asymmetric; and
    an insulation liner on sidewalls of the source/drain contact,
    wherein the source/drain contact comprises a lower contact portion facing the pair of gate structures in the first horizontal direction and an upper contact portion that is integral to the lower contact portion, the upper contact portion comprises a horizontal extension, which extends on an upper corner of a first gate structure of the pair of gate structures and overlaps at least a portion of the first gate structure in the vertical direction,
    wherein the insulation liner comprises a first local region that electrically separates the upper corner of the first gate structure and the horizontal extension of the source/drain contact, and a second local region that is farther from the substrate than the first local region, and
    wherein a thickness of the first local region is greater than that of the second local region.

12. The integrated circuit device of claim 11, wherein opposing sides of the first gate structure are asymmetric in the first horizontal direction.

13. The integrated circuit device of claim 11, wherein the gate structures each comprise a gate line, an insulation capping line on a top surface of the gate line, and insulation spacers on sidewalls of the gate line and the insulation capping line,
    wherein the insulation spacer of the first gate structure has a top portion defining a portion of the upper corner, and
    wherein at least a portion of the top portion is closer to the substrate than a topmost surface of the first gate structure.

14. The integrated circuit device of claim 11, wherein the first gate structure comprises a first gate line and a second gate structure of the pair of gate structures comprises a second gate line, and
    wherein, in the first horizontal direction, a first distance between the source/drain contact and the first gate line is less than a second distance between the source/drain contact and the second gate line.

15. The integrated circuit device of claim 11, further comprising:
    a top insulation layer on top surfaces of the first gate structure and a second gate structure of the pair of gate structures,
    wherein the insulation liner and the source/drain contact penetrate through the top insulation layer in the vertical direction, and
    wherein the second local region of the insulation liner is between the top insulation layer and the source/drain contact.

16. The integrated circuit device of claim 11, wherein the insulation liner comprises a first insulation liner and a second insulation liner sequentially stacked on the first gate structure, the second insulation liner comprising a different material and/or density than the first insulation liner,
    wherein the first insulation liner has a same thickness in the first local region and the second local region, and
    wherein a thickness of the second insulation liner in the first local region is greater than a thickness of the second insulation liner in the second local region.

17. The integrated circuit device of claim 11, wherein the insulation liner further comprises a third local region between a sidewall of the first gate structure and the lower contact portion of the source/drain contact, and wherein the thickness of the first local region is greater than that of the third local region.

18. The integrated circuit device of claim 11, wherein the pair of gate structures comprises:

the first gate structure comprising a first gate line extending along the second horizontal direction on the fin-type active region, a first insulation capping line on a top surface of the first gate line, and a first insulation spacer between the first gate line and the source/drain contact; and a second gate structure comprising a second gate line extending along the second horizontal direction on the fin-type active region, a second insulation capping line on a top surface of the second gate line, and a second insulation spacer between the second gate line and the source/drain contact, and, in the vertical direction, a height of a top surface of at least a portion of the first insulation spacer is less than a height of a topmost surface of the second insulation spacer relative to the substrate.

19. An integrated circuit device comprising:

a fin-type active region extending along a first horizontal direction on a substrate;

a source/drain region on the fin-type active region, a pair of nanosheet stacks on a fin top surface of the fin-type active region and spaced apart from each other in the first horizontal direction with the source/drain region therebetween, a pair of gate structures comprising a pair of gate lines that surround the pair of nanosheet stacks on the fin-type active region and extend along a second horizontal direction crossing the first horizontal direction and a pair of outer insulation spacers on sidewalls of the pair of gate lines;

a source/drain contact that extends along a vertical direction on the source/drain region and has opposing sides in the first horizontal direction that are asymmetric; and an insulation liner on sidewalls of the source/drain contact, wherein the source/drain contact comprises a lower contact portion between the pair of gate structures in the first horizontal direction and an upper contact portion extending from the lower contact portion, the upper contact portion comprises a horizontal extension, which extends on an upper corner of a first gate structure of the pair of gate structures and overlaps at least a portion of the first gate structure in the vertical direction, the insulation liner comprises a first local region between the upper corner of the first gate structure and the horizontal extension of the source/drain contact and a second local region that is farther from the substrate than the first local region, and a thickness of the first local region is greater than that of the second local region.

20. The integrated circuit device of claim 19, wherein the insulation liner comprises a first insulation liner and a second insulation liner sequentially stacked on the first gate structure, the second insulation liner comprising a different material and/or density than the first insulation liner, wherein the first insulation liner is in contact with the first gate structure and has a same thickness in the first local region and the second local region, and wherein the second insulation liner is in contact with the source/drain contact and a thickness of the second insulation liner in the first local region is greater than a thickness of the second insulation liner in the second local region.

* * * * *